US005945700A

United States Patent [19]

Mizutani

[11] Patent Number: 5,945,700

[45] Date of Patent: Aug. 31, 1999

[54] SEMICONDUCTOR DEVICE HAVING A SEMICONDUCTOR SWITCH STRUCTURE

[75] Inventor: Hiroshi Mizutani, Tokyo, Japan

[73] Assignee: NEC Corporation, Tokyo, Japan

[21] Appl. No.: 08/899,664

[22] Filed: Jul. 24, 1997

[30] Foreign Application Priority Data

Jul. 24, 1996 [JP] Japan .................................... 8-194876

[51] Int. Cl.[6] ...................................................... H01L 29/80

[52] U.S. Cl. .......................... 257/259; 257/664; 330/286; 333/246

[58] Field of Search .................................... 257/664, 259; 330/286; 333/246

[56] References Cited

U.S. PATENT DOCUMENTS

| | | | |
|---|---|---|---|
| 4,456,888 | 6/1984 | Ayasli | 330/277 |
| 4,733,195 | 3/1988 | Tserng et al. | 330/286 |
| 4,973,918 | 11/1990 | Schindler | 330/277 |
| 5,177,381 | 1/1993 | Friesen et al. | 307/492 |
| 5,546,049 | 8/1996 | Wen et al. | 330/277 |
| 5,689,210 | 11/1997 | Lange | 330/54 |

FOREIGN PATENT DOCUMENTS

| | | |
|---|---|---|
| 55-65469 | 5/1980 | Japan . |
| 61-97861 | 6/1986 | Japan . |
| 2-246373 | 10/1990 | Japan . |
| 5-206818 | 8/1993 | Japan . |
| 6-311020 | 11/1994 | Japan . |
| 7-58620 | 3/1995 | Japan . |
| 7-153848 | 6/1995 | Japan . |

OTHER PUBLICATIONS

Yoshitada Iyama et al.; Distributed Type FET T/R. Switch vol.J79–C–I No. 8 pp. 330–338; Aug. 1996.

Microwave Switching; pp. 66, 68, 70.

*Primary Examiner*—Sara Crane

[57] ABSTRACT

A semiconductor device that has a structure wherein plural incremental circuits each of which is structured by a combination of a field effect transistor and a transmission line are connected and arranged in serial, in the arrangement of the above incremental circuits, the total length of the transmission lines of respective incremental circuits is longer than at least 1/16 of a wavelength of used microwave or millimeter-wave, and the number of arranged incremental circuits is numerous, as a result, the above transmission lines have a function as a distributed-constant line.

17 Claims, 24 Drawing Sheets

SEMICONDUCTOR DEVICE HAVING A SEMICONDUCTOR SWITCH STRUCTURE

BACKGROUNDS OF THE INVENTION

1. Field of the Invention

The present invention relates to a semiconductor device having a semiconductor switch structure that uses a transmission line such as a micro striped line comprising a metallic conductor and a field effect transistor.

2. Description of the Related Art

A semiconductor switch element using a field effect transistor (FET) may be expressed equivalently by resistance and capacitor. For example, an FET inserted into a transmission line is equivalent to resistance in ON status, while it becomes equivalent to capacitor in OFF status. As representative switch circuits using this kind of FET, there are, for example, a serial structure switch circuit wherein source and drain of FET 1901 are connected to an input terminal and an output terminal respectively as shown in FIG. 19, a parallel structure switch circuit wherein a source and drain of FET 2102 are connected to 2-line type transmission line respectively as shown in FIG. 21, a serial-parallel structure switch circuit which comprises FET 2301 and FET 2302 wherein the above serial structure and parallel structure are combined as shown in FIG. 23, a switch circuit that uses resonance between a serial FET 2501 and a coil 2502 parallelly connected thereto as shown in FIG. 25, and a switch circuit of a structure wherein λ/4 line 2702 is serially connected to a drain or a source of parallel connection FET 2701 as shown in FIG. 27.

In order to obtain large electric power in these switch circuits using FET, it is best to increase the gate width of FET. This in turn means to reduce the resistance value in an equivalent circuit of FET and increase the capacity value.

However, in each of the above switch circuits as the conventional semiconductor devices in the prior art, when gate width was increased so as to obtain large electric power, insertion loss or isolation that was determined by the resistance value and capacity value of FET was deteriorated in some cases, which has been a problem in the conventional semiconductor devices according to the prior art. This problem is explained more concretely hereinafter.

The transparent characteristics of each switch circuit in the case when the gate width Wg of FET 1901, 2101, 2301, 2302, 2501, and 2701 that structure respective switch circuits shown in FIG. 19, FIG. 21, FIG. 23, FIG. 25 and FIG. 27 is 100 μm, and the case when that is 1 mm are shown in FIG. 20, FIG. 22, FIG. 24, FIG. 26 and FIG. 28. For example, the transparent characteristics of the serial structure switch circuit shown in FIG. 19 are shown in FIG. 20. In this FIG. 20, the characteristics of FET 1901 in the case when the gate width Wg is 1 mm are represented by a solid line, while those in the case when the gate width Wg is 100 μm are represented by a dotted line. As shown in the figure, when the gate width Wg is 1 mm, the capacity value increases, as a result, the isolation, i.e., the power breaking capacity of switch at the moment when the switch is turned OFF decreases in comparison with the case when the gate width Wg is 100 μm.

And, the transparent characteristics of a parallel structure switch circuit shown in FIG. 21 is shown in FIG. 22. In this FIG. 22 in turn, the characteristics of FET 2101 in the case when the gate width Wg is 1 mm are represented by solid lines I and II, while those in the case when the gate width Wg is 100 μm are represented by dotted lines III and IV. In reference to FIG. 22, the isolation appears to increase in the case when the gate width is 1 mm (characteristicsII) more than in the case when the gate width is 100 μm (characteristicsIV). However, the insertion loss, i.e., the power loss of switch at the moment when the switch is turned ON increases in the case when the gate width is 1 mm (characteristicsI) more than in the case when the gate width is 100 μm (characteristics III).

While, the transparent characteristics of a serial- parallel structure switch circuit shown in FIG. 23 are shown in FIG. 24. In this FIG. 24, the characteristics of FET 2302 in the case when the gate width Wg is 1 mm are represented by solid lines V and VI, while those in the case when the gate width Wg is 100 μm are represented by dotted lines VII and VIII. In reference to FIG. 24, the isolation changes according to the frequency as shown in characteristicsVI and characteristicsVIII, but at the same frequency, the isolation increases in the case when the gate width is 1 mm (characteristicsVI) more than in the case when the gate width is 100 μm (characteristicsVIII). However, the insertion loss becomes larger in the case when the gate width is 1 mm (characteristics V) more than in the case when the gate width is 100 μm (characteristics VII).

By the way, in the switch circuit of the serial-parallel structure in FIG. 23, the gate width of FET 2301 may differ from that of FET 2302. For example, as shown in FIG. 29, the transparent characteristics, both the isolation loss and the isolation, in the case when the gate width of FET 2301 is 100 μm and that of FET 2302 is 1 mm change according to the increase of the frequency as shown in FIG. 30. But, even in the case when FET having different width is used, the insertion loss becomes large.

Further, the transparent characteristics of a switch circuit of a structure that uses a serial FET 2501 and a coil 2502 shown in FIG. 25 are shown in FIG. 26. In this FIG. 26, the characteristics in the case when the gate width Wg of FET 2501 is 1 mm are represented by a solid line. As illustrated, though preferable insertion loss can be obtained locally, the range is very narrow because resonance is used.

And the transparent characteristics of a switch circuit having a structure of a parallel FET 2701 and a serial λ/4 line 2702 shown in FIG. 27 are shown in FIG. 28. In this FIG. 28, the characteristics in the case when the gate width Wg of FET 2701 is 1 mm are represented by a dashed line IX and a solid line X. As known from the characteristicsX, the insertion loss at a high frequency band (60 GHz in this case) becomes large.

As mentioned in details in the above, it is difficult to obtain desired transparent characteristics in the conventional respective switch circuits according to the prior art. For instance, when the isolation loss is set at 1.5 dB and the isolation is set to 20 dB as the characteristic standards at the frequency band of 60 GHz, if the gate width Wg is set to 1 mm, the only circuit that satisfies the standards of isolation loss and isolation among the above conventional switch circuits is the circuit using the serial FET 2501 and a coil 2502 shown in FIG. 25. However, in the above switch circuit, as mentioned above, desired characteristics in insertion loss can be obtained only in an extremely narrow band.

As described heretofore, in the above respective switch circuits as semiconductor devices according to the prior art, there has been not any circuit structure that satisfies the requirement to increase the gate width of FET as a semiconductor switch element so as to obtain large power transmission, and the requirement to attain a low insertion loss and a high isolation especially at a high frequency and in a wide band at the same time, which has been the problem with the conventional semiconductor devices according to the prior art.

SUMMARY OF THE INVENTION

Accordingly, an object of the present invention is to provide a semiconductor device that enables to satisfy the requirements to attain a low insertion loss and a high isolation, especially at a high frequency and at the same time in a wide band.

According to one aspect of the invention, a semiconductor device having a semiconductor switch structure using a transmission line and a field effect transistor, comprises plural pieces of incremental circuits that are structured by combination of a field effect transistor and a transmission line in serial;

in arrangement of said incremental circuits;

total length of transmission lines of said respective incremental circuits is longer than at least 1/16 of propagation wavelength of used microwave or millimeter-wave; and number of said incremental circuits arranged is numerous or infinite thereby said transmission lines have a function as a distributed-constant line.

The incremental circuits may comprise two pieces of field effect transistors whose drains are connected to each other, two first transmission lines that are connected respectively to sources of the two pieces of field effect transistors, and a second transmission line that is connected to drains of the two pieces of field effect transistors, wherein in the arrangement of the incremental circuits;

the first transmission lines and the second transmission line in the respective incremental circuits are connected in serial respectively, gates of the two field effect transistors are connected in common to gates of field transistor in other above incremental circuits that are connected respectively by the first transmission lines, in the incremental circuits positioned at one end of the arrangement, the line ends of the serially connected two first transmission lines that are not connected to the field effect transistor is set as a first input/output terminal, in the incremental circuits positioned at the other end the arrangement, the line ends of the serially connected two first transmission lines that are not connected to the field effect transistor is set as a second input/output terminal, and further the total length of the plural first transmission lines connected in serial, and the total length of the plural second transmission lines connected in serialare set to be longer than 1/16 of the propagation wavelength of signals that the first and second input/output terminals input and output.

The incremental circuits may comprise field effect transistors whose source are grounded, transmission lines that are connected to drains of said field effect transistors, and in the arrangement of said incremental circuits, said transmission lines in the said respective incremental circuits are connected in serial respectively, gates of said field effect transistors are connected in common to gates of field transistor in other above incremental circuits, in said incremental circuits positioned at one end of said arrangement, the line ends of said serially connected to said transmission line that are not connected to said field effect transistor is set as a first input/output terminal, in said incremental circuits positioned at the other end said arrangement, the line ends of said serially connected to said transmission line that are not connected to said field effect transistor is set as a second input/output terminal, the total length of said plural transmission lines connected in serial are set to be longer than 1/16 of the propagation wavelength of signals that said first and second input/output terminals input and output.

The incremental circuits may comprise said incremental circuits comprising a first field effect transistor, a first transmission line that is connected to the source of said first field effect transistor, a second transmission line that is connected to the drain of said first field effect transistor, a second field effect transistor whose drain is connected to the drain of said first field effect transistor and said second transmission line, and whose source is grounded, wherein in the arrangement of said incremental circuits;

said first transmission line and said second transmission line in said respective incremental circuits are connected in serial respectively, gates of said first field effect transistor are connected in common to each other, while gates of said second field effect transistor are connected in common to each other, in said incremental circuits positioned at one end of said arrangement, the line ends of said serially connected two first transmission lines that are not connected to said field effect transistor is set as a first input/output terminal, in said incremental circuits positioned at the other end said arrangement, the line ends of said serially connected to said second transmission line that are not connected to said field effect transistor is set as a second input/output terminal, and the total length of said plural first transmission lines connected in serial, and the total length of said plural second transmission lines connected in serial are set to be longer than 1/16 of the propagation wavelength of signals that said first and second input/output terminals input and output.

The incremental circuits may comprise said incremental circuits comprising a first field effect transistor, a first transmission line that is connected to the source of said first field effect transistor, a second transmission line that is connected to the drain of said first field effect transistor, and has an identical characteristic impedance to said first transmission line, a second field effect transistor whose drain is connected to the drain of said first field effect transistor and said second transmission line, and whose source is grounded, wherein in the arrangement of said incremental circuits, said first transmission line and said second transmission line in said respective incremental circuits are connected in serial respectively, gates of said first field effect transistor are connected in common to each other, while gates of said second field effect transistor are connected in common to each other, in said incremental circuits positioned at one end of said arrangement, the line ends of said serially connected to said first transmission line that are not connected to said field effect transistor is set as a first input/output terminal, in said incremental circuits positioned at the other end said arrangement, the line ends of said serially connected to said second transmission lines that are not connected to said field effect transistor is set as a second input/output terminal, and the total length of said plural first transmission lines connected in serial, and the total length of said plural second transmission lines connected in serial are set to be longer than 1/16 of the propagation wavelength of signals that said first and second input/output terminals input and output.

The incremental circuits may comprise said incremental circuits comprising a first field effect transistor, a first transmission line that is connected to the source of said first field effect transistor, a second transmission line that is connected to the drain of said first field effect transistor, and has a different characteristic impedance from said first transmission line, a second field effect transistor whose drain is connected to the drain of said first field effect transistor and said second transmission line, and whose source is grounded, wherein in the arrangement of said incremental circuits, said first transmission line and said second transmission line in said respective incremental circuits are connected in serial respectively, gates of said first field effect transistor are connected in common to each other, while gates of said second field effect transistor are connected in common to each other, in said incremental circuits positioned at one end of said arrangement, the line ends of said serially connected to said first transmission line that are not connected to said field effect transistor is set as a first input/output terminal, in said incremental circuits positioned at the other end said arrangement, the line ends of said serially connected to said second transmission line that are not connected to said field effect transistor is set as a second input/output terminal, and the total length of said plural first transmission lines connected in serial, and the total length of said plural second transmission lines connected in serial are set to be longer than 1/16 of the propagation wavelength of signals that said first and second input/output terminals input and output.

The incremental circuits comprise a first incremental circuit having two pieces of field effect transistors and two transmission lines, and a second incremental circuit having one piece of field effect transistor and a transmission line, said first incremental circuit comprising a first field effect transistor, a first transmission line that is connected to the source of said first field effect transistor, a second transmission line that is connected to the drain of said first field effect transistor, and has a different characteristic impedance from said first transmission line, a second field effect transistor whose drain is connected to the drain of said first field effect transistor and said second transmission line, and whose source is grounded, and said second incremental circuit comprising a field effect transistor whose source is grounded, a transmission line that is connected to the drain of said field effect transistor, the arrangement of said incremental circuits is structured by a serial connection of the arrangement of said first incremental circuit, and the arrangement of said second incremental circuit, and in the arrangement of said first incremental circuit, said first transmission line and said second transmission line in said first incremental circuit are connected in serial respectively, gates of said first field effect transistor are connected in common to each other, while gates of said second field effect transistor are connected in common to each other, and in the arrangement of said second incremental circuit, said transmission lines in said second incremental circuit are connected in serial respectively, the gate of said field effect transistor is connected in common to the gates in the other above second incremental circuit, and said second transmission line of said first incremental circuit positioned at one end of the arrangement of the first incremental circuit is connected in serial to said transmission line of said second incremental circuit positioned at the other end of said first incremental circuit, the gate of said second field effect transistor in said first incremental circuit positioned at one end of the arrangement of said first incremental circuit is connected in common with said field effect transistor in said second incremental circuit positioned at the other end of the arrangement of said second incremental circuit, in said incremental circuits positioned at the end of the arrangement of said first incremental circuit that is not connected to said second incremental circuit, the line ends of said serially connected said first transmission line that are not connected to said field effect transistor is set as a first input/output terminal, in said incremental circuits positioned at the end the arrangement of said second incremental circuit that is not connected to said first incremental circuit, the line ends of said serially connected said second transmission line that are not connected to said field effect transistor is set as a second input/output terminal, and the total length of said second transmission lines in the serially connected plural above first incremental circuits and the transmission line in said second incremental circuit is set to be longer than 1/16 of the propagation wavelength of signals that said first and second input/output terminals input and output.

According to another aspect of the invention, a semiconductor device having a semiconductor switch structure using a combination of field effect transistors covered with active layers, comprises said semiconductor device is structured by a combination of a gate electrode and a pair of ohmic electrodes that pinch said gate electrode, and part of said gate electrode and said ohmic electrodes are covered with an active layer; and length of said gate electrode in said active layer, and the length of said ohmic electrodes are set to be longer at least 1/16 of propagation wavelength of used microwave or millimeter-wave.

In the preferred construction, a desired number of incremental circuits, comprising 2 pieces of field effect transistors wherein one of said pair of ohmic electrodes is set as a shared electrode, and covered with said active layer, are arranged at certain intervals so that said gate electrodes should be arranged in a straight line, and corresponding above ohmic electrodes of neighboring above incremental circuits are connected, one common end of two lines to which said ohmic electrodes that is not the shared electrode are connected is set as a first input/output terminal;

the other end of the line to which one of said ohmic electrodes that is the shared electrode is connected is set as a second input/output terminal;

said two gate electrodes pinched by the ohmic electrodes of said two field effect transistors are connected to each other outside of said active layer, and each length of said two gate electrodes in said active layer, and the length of said respective lines connecting to said ohmic electrodes are set to be longer than at least 1/16 of propagation wavelength of used microwave or milimeter wave.

In the preferred construction, two pieces of field effect transistors covered with said active layer are arranged wherein one of said pair of ohmic electodes is set as a shared electrode, the ohmic electrode that is not grounded and is not said shared electrode is connected out of said active layer, and the connection point concerned is set as a a first input/output terminal, the end opposite to said first input/output terminal of thr ohmic electrode that is said shared electrode is set as a second input/output terminal, said two gate electrodes pinched by said two ohmic electrodes of said field effect transistor are connected out of said active layer, and each length of said two gate electrodes in said active layer, and the length of said ohmic electrodes are respectively set to be longer than at least 1/16 of propagation wavelength of used microwave or milimeter wave.

In the preferred construction, a desired number of incremental circuits, comprising field effect transistors having said pair of ohmic electrodes, and covered with said active layer, are arranged at certain intervals so that said gate electrodes should be arranged in a straight line, and one of corresponding above ohmic electrodes of neighboring above incremental circuits is connected, while the other is grounded, one end of the line to which said ohmic electrodes are connected is set as a first input/output terminal, while the other end is set as a second input/output terminal, and the length of said line connecting to said ohmic electrodes in said active layer is set to be longer than at least 1/16 of propagation wavelength of used microwave or milimeter wave.

In another preferred construction, field effect transistors covered with said active layer are arranged having above pair of ohmic, and one of said ohmic electrodes is grounded, one end of said ohmic electrode that is not grounded is set as a first input/output terminal, while the other end is set as a second input/output terminal, and each of the length of said gate electrodes in said active layer, and the length of the ohmic electrode that is not grounded are set to be longer than at least 1/16 of propagation wavelength of used microwave or millimeter-wave.

In another preferred construction, a desired number of incremental circuits, comprising two pieces of field effect transistors wherein one of said pair of ohmic electrodes is set as a shared electrode, and covered with said active layer, are arranged at certain intervals so that said gate electrodes should be arranged in a straight line, ohmic electrodes that are said shared electrodes among that corresponding above ohmic electrodes of neighboring above incremental circuits are connected, while the other of ohmic electrodes that are not said shared electrodes is grounded, one end of the line to which said ohmic electrodes are connected is set as a first input/output terminal, the other end opposite to said first input/output terminal of the line to which the ohmic electrodes that are said shared electrodes is set as a second input/output terminal, and each of the length of said two gate electrodes, each of the length of said lines to which said ohmic electrodes are connected are set to be longer than at least 1/16 of propagation wavelength of used microwave or millimeter-wave.

Also, two pieces of field effect transistors covered with said active layer are arranged wherein one of said pair of ohmic electrodes of one of said field effect transistors is set as a shared electrode, and one of said ohmic electrodes is grounded one end of said ohmic electrode that is not said shared electrode and is not grounded is set as a first input/output terminal, the end opposite to said first input/output terminal of the ohmic electrode that is said shared electrode is set as a second input/output terminal, and each of the length of said two gate electrodes in said active layer, and the length of each ohmic electrode are set to be longer than at least 1/16 of propagation wavelength of used microwave or millimeter-wave.

In the above-mentioned construction, two pieces of field effect transistors covered with said active layer are arranged wherein one of said pair of ohmic electrodes of one of said field effect transistors is set as a shared electrode, and one of said ohmic electrodes is grounded, the length of said ohmic electrode that is not said shared electrode and is not grounded differs from the length of said ohmic electrode, and the length of said gate electrode that is pinched by said ohmic electrode that is not said shared electrode and is not grounded and the ohmic electrode that is said shared electrode differs from the length of other above gate electrode, one end of said ohmic electrode that is not said shared electrode and is not grounded is set as a first input/output terminal, the end opposite to said first input/output terminal of the ohmic electrode that is said shared electrode is set as a second input/output terminal, and each of the length of the ohmic electrode that is the shared electrode in said active layer, the length of the ohmic electrode that is grounded, and the length of one gate electrode that is pinched by said pair of ohmic electrodes is set to be longer than at least 1/16 of propagation wavelength of used microwave or millimeter-wave.

In the above-mentioned construction, two pieces of field effect transistors covered with said active layer are arranged wherein one of said pair of ohmic electrodes of one of said field effect transistors is set as a shared electrode, and one of said ohmic electrodes is grounded, the length of said ohmic electrode that is not said shared electrode and is not grounded is shorter than the length of said ohmic electrode, and the length of said gate electrode that is pinched by said ohmic electrode that is not said shared electrode and is not grounded and the ohmic electrode that is said shared electrode is shorter than the length of other above gate electrode, one end of said ohmic electrode that is not said shared electrode and is not grounded is set as a first input/output terminal, the end opposite to said first input/output terminal of the ohmic electrode that is said shared electrode is set as a second input/output terminal, and each of the length of the ohmic electrode that is the shared electrode in said active layer, the length of the ohmic electrode that is grounded, and the length of one gate electrode that is pinched by said pair of ohmic electrodes is set to be longer than at least 1/16 of propagation wavelength of used microwave or millimeter-wave.

Also, two pieces of field effect transistors covered with said active layer are arranged wherein one of said pair of ohmic electrodes of one of said field effect transistors is set as a shared electrode, and one of said ohmic electrodes is grounded, the width of said ohmic electrode that is not said shared electrode and is not grounded differs from the width of the ohmic electrode that is said shared electrode, one end of said ohmic electrode that is not said shared electrode and is not grounded is set as a first input/output terminal, the end opposite to said first input/output terminal of the ohmic electrode that is said shared electrode is set as a second input/output terminal, and each of the length of said two gate electrodes in said active layer, and the length of each ohmic electrode are set to be longer than at least 1/16 of propagation wavelength of used microwave or millimeter-wave.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessarily obscure the present invention.

Figure 1:
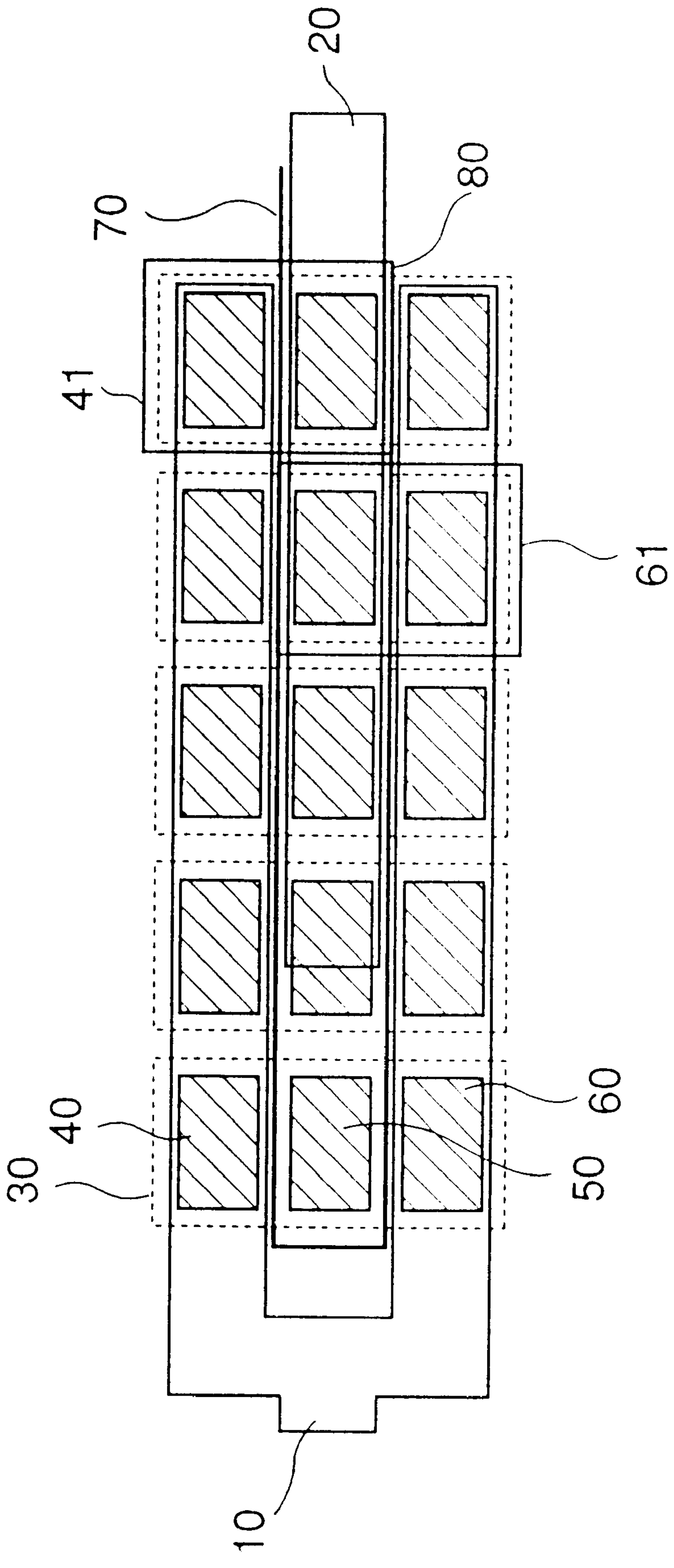
FIG. 1 is a top view showing a structure of a semiconductor device according to the first preferred embodiment under the present invention.

FIG. 1 is a top view showing a structure of a semiconductor device according to the first preferred embodiment under the present invention.

As shown in FIG. 1, a semiconductor device of the first preferred embodiment under the present invention has a structure wherein two pieces of FET 41 and FET 61 having a gate electrode and a pair of ohmic electrodes pinching the above gate electrode and facing to each other is made into an incremental circuit, and a desired number of the above incremental circuits are arranged. A first FET 41 and a second FET 61 structuring an incremental circuit are surrounded by an active layer 30, and they use a second ohmic electrode as a shared electrode 50. Two pairs of FET 41 and FET 61 structuring a incremental circuit may be described as a concentrated constant.

Neighboring incremental circuits are arranged at certain intervals and so that gate electrodes should be in a straight line. And ohmic electrodes corresponding to neighboring incremental circuits are connected with lines that have an identical characteristic impedance. Namely, in FIG. 1, a gate electrode 70 of the first FET 41 and a gate electrode 80 of the second FET 61 are connected at the outside of an active layer 30 of plural connected incremental circuits. And the line that connects a first ohmic electrode 40 of the first FET 41 is connected with the line that connects a first ohmic electrode 60 of the second FET 41, and the center of the connected lines becomes a first input/output terminal 10. The end opposite to the first input/output terminal 10, of the line that connects the second ohmic electrode of the first FET 41 and a shared electrode 50 structuring the second ohmic electrode of the second FET 41 becomes a second input/output terminal 20.

In this embodiment, it is necessary that each of the length of gate electrode 70 of the first FET 41 and the length of the gate electrode 80 of the second FET 61 inside of the active layer 30, the length of the line including the ohmic electrode 40 in the first FET 41, the length of the line including the first ohmic electrode 60 of the second FET 61, and the length of the line including the shared electrode 50 should be at least over 1/16 of the propagation wavelength of used microwave or millimeter-wave. At this moment, the ohmic electrode functions as a distributed-constant line.

In general, when impedance of value $Z_0$ is connected to the input/output terminal, and transparent characteristics $|S_{2l}|^2$ of transmission line whose characteristic impedance is Z and length is L is expressed by the following equation (1) if the propagation wavelength of used microwave or millimeter-wave is λ:

$$|S_{21}| = \frac{}{4Z^2 {Z_0}^2 + (Z^2 + {Z_0}^2)^2 - (Z^2 - {Z_0}^2)^2 \cos(4\pi L/\lambda)} \quad (1)$$

From the above equation, in the case $Z=Z_0$, it occurs always that $|S_{2l}|^2=1$ irrespective of the length of transmission line. On the other hand, in the case of $Z \neq Z\,0$, when the length L of transmission line is equal to 1/4 of the propagation wavelength of microwave or millimeter-wave ($L=\lambda/4$), the value of cosine trigonometric function in the above equation becomes −1, the value of denominator in the above equation becomes maximum, and thus it is known that the transparent characteristics go down most and loss becomes large.

And when the length of transmission line is at least below 1/16 of the propagation wavelength of used microwave or millimeter-wave ($L \leqq \lambda/1\ 6$) , since the value of the cosine trigonometric function in the above equation is almost equal to 1, the decline of the transparent characteristics is almost negligible. In this case, the transmission line concerned may be handled with as a concentrated constant line whose length L may be ignored. On the other hand, when the length of transmission line is at least over 1/16 of the propagation wavelength of used microwave or millimeter-wave ($L>\lambda/1\ 6$), since the value of the cosine trigonometric function in the above equation deviates greatly from 1, the transmission line concerned may be evaluated to function as a distributed-constant line that depends on the length L.

Figure 2:
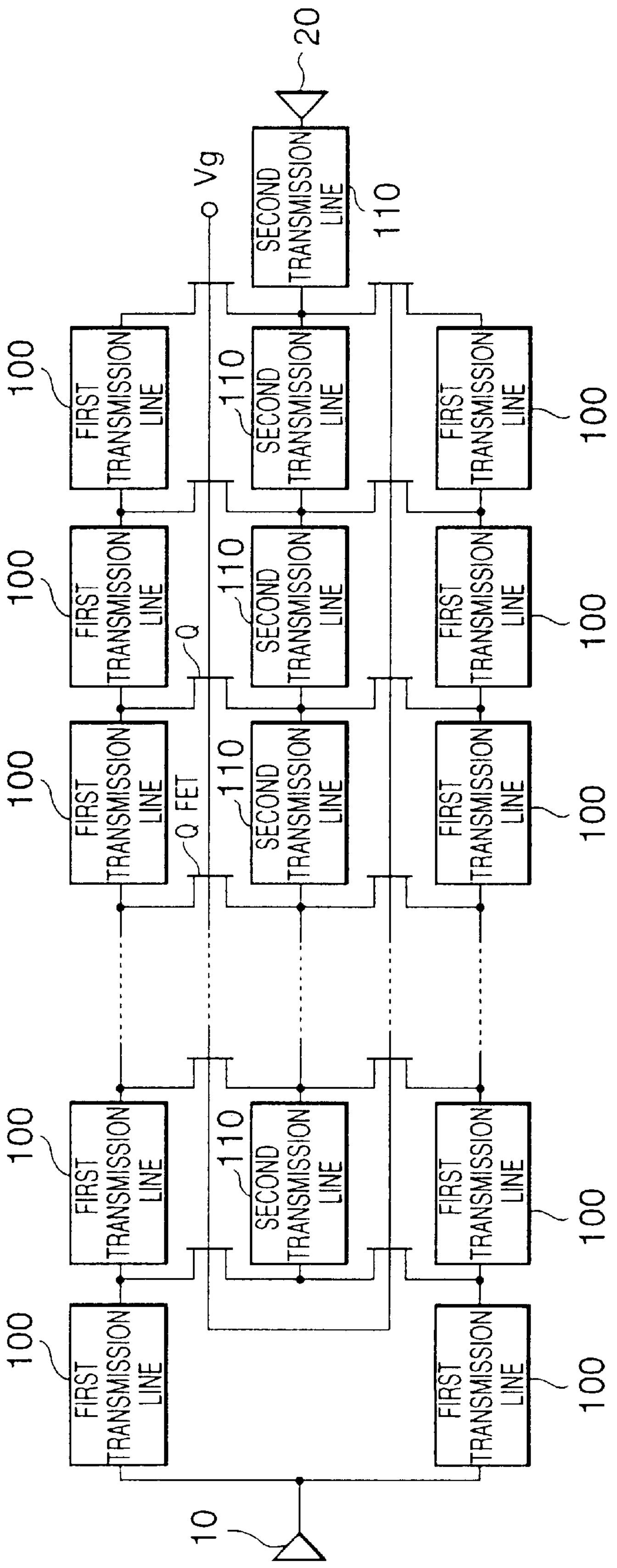
FIG. 2 is a top view showing a structure of a semiconductor device according to the second preferred embodiment under the present invention.

FIG. 2 is a top view showing a structure of a semiconductor device according to the second preferred embodiment under the present invention. As shown in this FIG. 2, the equivalent circuit of this semiconductor device has a transmission line comprising a dielectric substrate and a metallic conductor, whose characteristic impedance is "Z" and length is "L", and an FET. And, it has a total of 2n pieces of incremental circuits, each of which comprises an FET, a first transmission line 100 whose one end is connected to the source of the above FET, and a second transmission line 110 whose one end is connected to the drain of the above FET. However, the number n of those incremental circuits share the second transmission line.

The source of FET Q of each incremental circuit is connected via the first transmission line 100 connected to the source of FET Q of neighboring other incremental circuit to the source of FET Q of the neighboring incremental circuit concerned. And the drain of FET Q of each incremental circuit is connected via the second transmission line 110 connected to the drain of FET Q of neighboring other incremental circuit to the source of FET Q of the neighboring incremental circuit concerned. And further, the gate of FET Q of each incremental circuit is connected in common so that it has the same potential Vg as the gate of FET Q of other incremental circuit.

And, among the first transmission line 100 structuring a circuit wherein at least 2 incremental circuits or more are connected, the line end not connected to FET Q is made as a first input/output terminal 10. and among the second transmission line 110 structuring the circuit concerned, the line end not connected to FET Q is made as a second input/output terminal 20. And the length of the first transmission line 100 structuring the circuit concerned is set to be longer than 1/16 of the propagation wavelength of used microwave or millimeter-wave, and the total length of the second transmission line 110 is set to be longer than 1/16 the propagation wavelength of used microwave or millimeter-wave.

The equivalent circuit of the semiconductor device shown in FIG. 2 comprises 2 units of the above circuits. The above 2 units of circuits share the second transmission line 110, and the first input/output terminal 10 of the 2 units are connected externally and share the first input/output terminal 10.

In the equivalent circuit structured as mentioned above, when FET Q of 2 units of incremental circuits to which a drain is connected in common is ON, electric power goes from the first input/output terminal 10 into the second input/output terminal 20, the switch circuit of the serial structure gets ON. On the contrary, when FET Q of 2 units of incremental circuits to which a drain is connected in common is OFF, electric power from the first input/output terminal 10 into the second input/output terminal 20 is shut off, and the switch circuit of the serial structure gets OFF. As known in comparison of FIG. 1 and FIG. 2, the line including the first ohmic electrode 40 of the first FET 41, the line including the first ohmic electrode 60 of the second FET 61, and the line including the shared electrode 50 have also the function as a distributed-constant line respectively.

Figure 3:
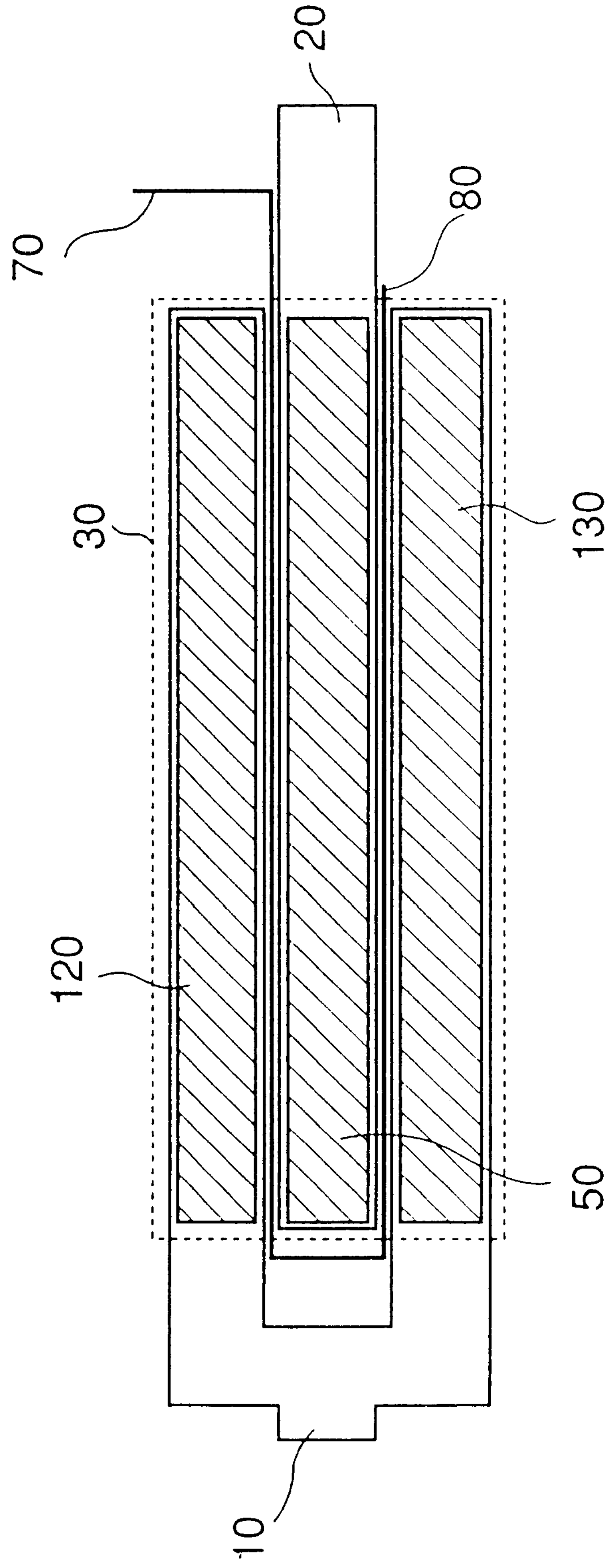
FIG. 3 is a diagram showing an equivalent circuit in the first and second preferred embodiments under the present invention.

FIG. 3 is a diagram showing an equivalent circuit in the first and second preferred embodiment under the present invention. By the way, in FIG. 3, identical codes are allotted to the same structure element as in the first preferred embodiment shown in FIG. 1.

As shown in this FIG. 3, the semiconductor device of the second preferred embodiment under the present invention has a gate electrode and 2 units of FET having a pair of ohmic electrodes pinching the gate electrode and facing to each other. Among the above 2 units of FET, the first ohmic electrode 120 of the first FET and the first ohmic electrode 130 of the second FET are connected by line outside of the active layer 30, and the center of the line is made as a first input/output terminal 10. While, the second ohmic electrode of the first FET and the second ohmic electrode of the second FET are set as a shared electrode 50. And the opposite end to the first input/output terminal 10 in the shared electrode 50 is set as a second input/output terminal 20.

And, a gate electrode 70 of the first FET is formed between the first ohmic electrode 120 of the first FET and the shared electrode 50, and a gate electrode 80 of the second FET is formed between the shared electrode 50 and the first ohmic electrode 130 of the second FET, and these 2 gate electrodes 70 and 80 are connected to each other outside of the active layer 30. That is, this preferred embodiment corresponds to the composition whose number of incremental elements in the first preferred embodiment is infinite.

In the second preferred embodiment under the present invention, the length of the gate electrode 70 of the first FET and the gate electrode 80 of the second FET in the active layer 30, the length of the first ohmic electrode 120 of the first FET in parallel with the gate electrodes 70 and 80, the length of the shared electrode 50 in the same direction, and the length of the first ohmic electrode 130 of the second FET in the same direction are set to be at least longer than 1/16 of the length of used microwave or millimeter-wave. Thereby, the equivalent circuit of the semiconductor device in the second preferred embodiment becomes same in practice as the transparent circuit of the semiconductor device in the first preferred embodiment shown in FIG. 1, as a consequence, the second preferred embodiment functions in the same manners as the first preferred embodiment.

Figure 4:
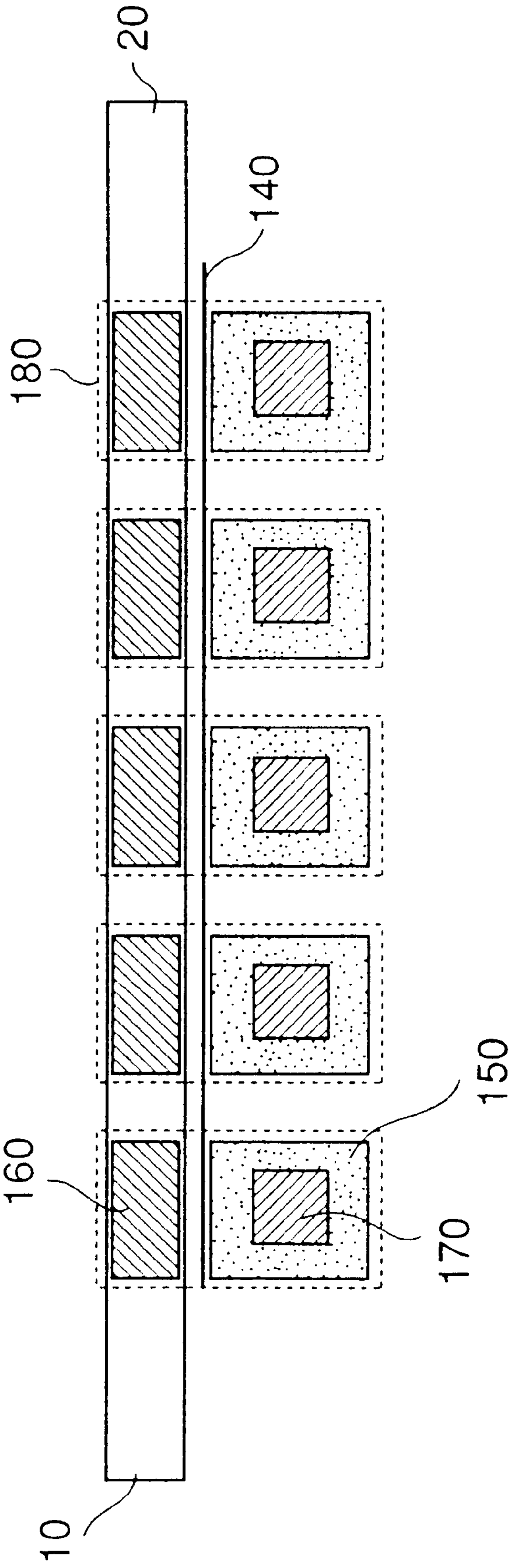
FIG. 4 is a top view showing a structure of a semiconductor device according to the third preferred embodiment under the present invention.

FIG. 4 is a top view showing a structure of a semiconductor device according to the third preferred embodiment under the present invention.

As shown in this FIG. 4, a semiconductor device in the third preferred embodiment under the present invention has a structure wherein a gate electrode 140 and FET comprising a pair of ohmic electrodes 150 and 160 pinching the above gate electrode and facing to each other are covered with an active layer 180 and made into a incremental circuit, and a desired number of the above incremental circuits are arranged. The first ohmic electrode 160 is grounded by a bia hole 170. The FET structuring incremental circuits may be described as a concentrated constant.

Neighboring incremental circuits are arranged at certain intervals and so that gate electrodes 140 should be in a straight line. And the second ohmic electrode between neighboring incremental circuits is connected by a line that has an identical characteristic impedance. One end of the line connected to the second ohmic electrode 160 is set as a first input/output terminal 10, while the other end is set as the second input/output terminal 20.

In this preferred embodiment, it is necessary that the length of the line including the second ohmic electrode 160 of FET should be longer than at least 1/16 of the propagation wavelength of used microwave or millimeter-wave.

Figure 5:
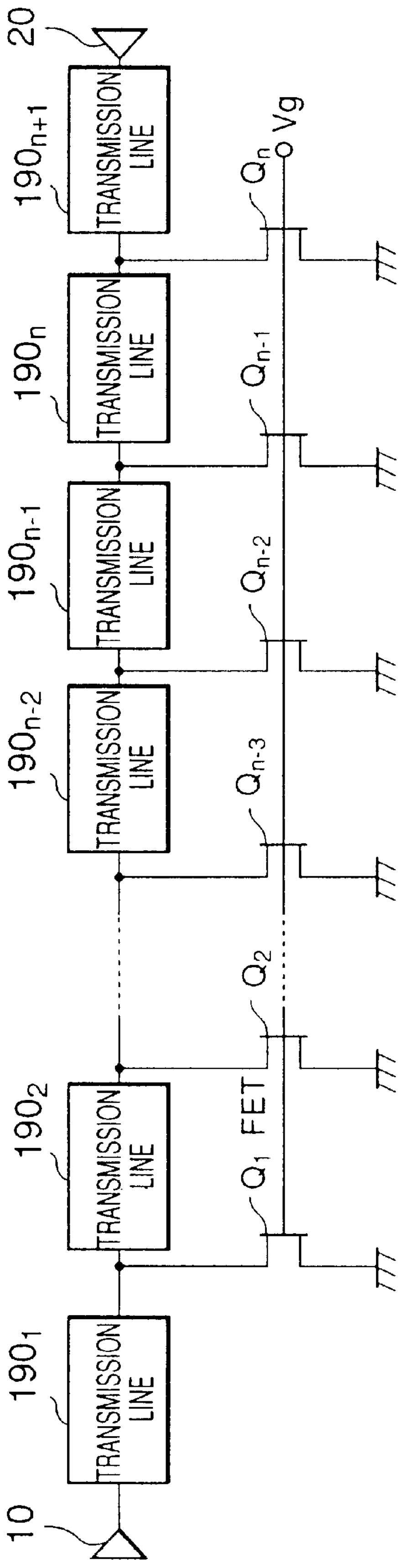
FIG. 5 is a top view showing a structure of a semiconductor device according to the fourth preferred embodiment under the present invention.

FIG. 5 is a top view showing a structure of a semiconductor device according to the fourth preferred embodiment under the present invention. As shown in this FIG. 5, in the transparent circuit of this semiconductor device, the number n+1 piece (wherein, n is an integer of 2 or more) of transmission lines 190 whose characteristic impedance is Z and length is "L" are connected in serial between the first input/output terminal 10 and the second input/output terminal 20, and a drain of FET Q whose source is grounded is connected to a common connection point between neighboring transmission lines 190. The number n of these gates of FET Q are connected in common, and are set so as to have the same gate electric potential Vg. Namely, the equivalent circuit shown in FIG. 5 structures a incremental circuit by a FET Q whose source is grounded and a transmission line 190 whose one end is connected to the drain of the above FET Q, and the number of the above incremental circuits are connected, and further a transmission line $\mathbf{190}_{n+1}$ is connected.

In the equivalent circuit structured as shown above, when FET Q gets ON by the , electric power from the first input/output terminal 10 to the second input/output terminal 20 is shut off, and the switch circuit of the parallel structure becomes OFF. On the contrary, when FET Q gets OFF by the gate electric potential Vg, electric power goes from the first input/output terminal 10 to the second input/output terminal 20, and the switch circuit of the parallel structure becomes ON. As known from the comparison of FIG. 4 and FIG. 5, the line including the second ohmic electrode 160 has also a function as a distributed-constant line. By the way, in FIG. 5, one unit of transmission line $\mathbf{190}_{n+1}$ that does not structure a incremental circuit is not n essential structure requirement, therefore, it may not be arranged.

Figure 6:
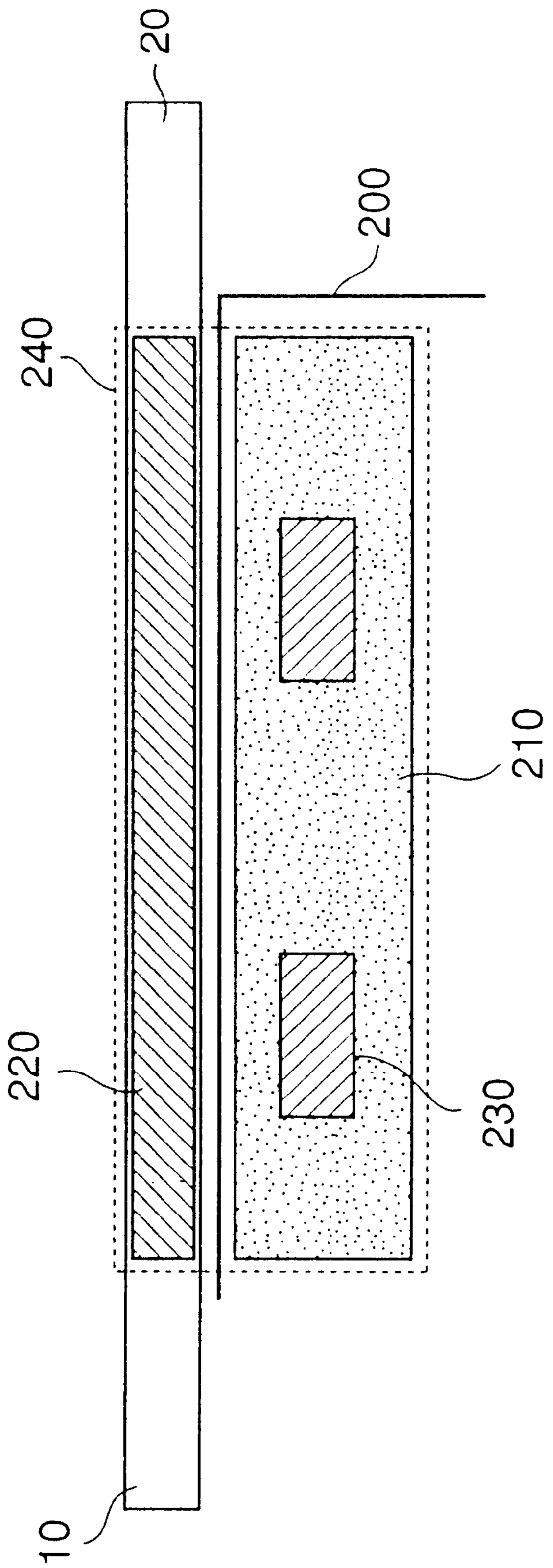
FIG. 6 is a diagram showing an equivalent circuit in the third and fourth preferred embodiments under the present invention.

FIG. 6 is a diagram showing an equivalent circuit in the third and fourth preferred embodiments under the present invention.

As shown this FIG. 6, a semiconductor device in the fourth preferred embodiment under the present invention has a structure wherein a gate electrode 200 and FET comprising a pair of ohmic electrodes 210 and 220 pinching the above gate electrode and facing to each other are covered with an active layer 240 and made into a incremental circuit. The first ohmic electrode 210 is grounded by a bia hole 230. One end of the second ohmic electrode 220 in parallel with the gate electrode 20 is set as a first input/output terminal 10, and the other end is set as a second input/output terminal 20, and signals of microwave or millimeter-wave are input and output. That is, this preferred embodiment corresponds to the composition whose number of incremental elements in the third preferred embodiment is infinite.

In the fourth, the length of the gate electrode 20 inside of the active layer 24, the length of the first ohmic electrode 21 and the second ohmic electrode 22 are set to be over at least 1/16 of the propagation wavelength of used microwave or millimeter-wave. Thereby, the equivalent circuit of the semiconductor device in the fourth preferred embodiment becomes same in practice as the transparent circuit of the semiconductor device in the third preferred embodiment shown in FIG. 5, as a consequence, the second preferred embodiment functions in the same manners as the third preferred embodiment.

Figure 7:
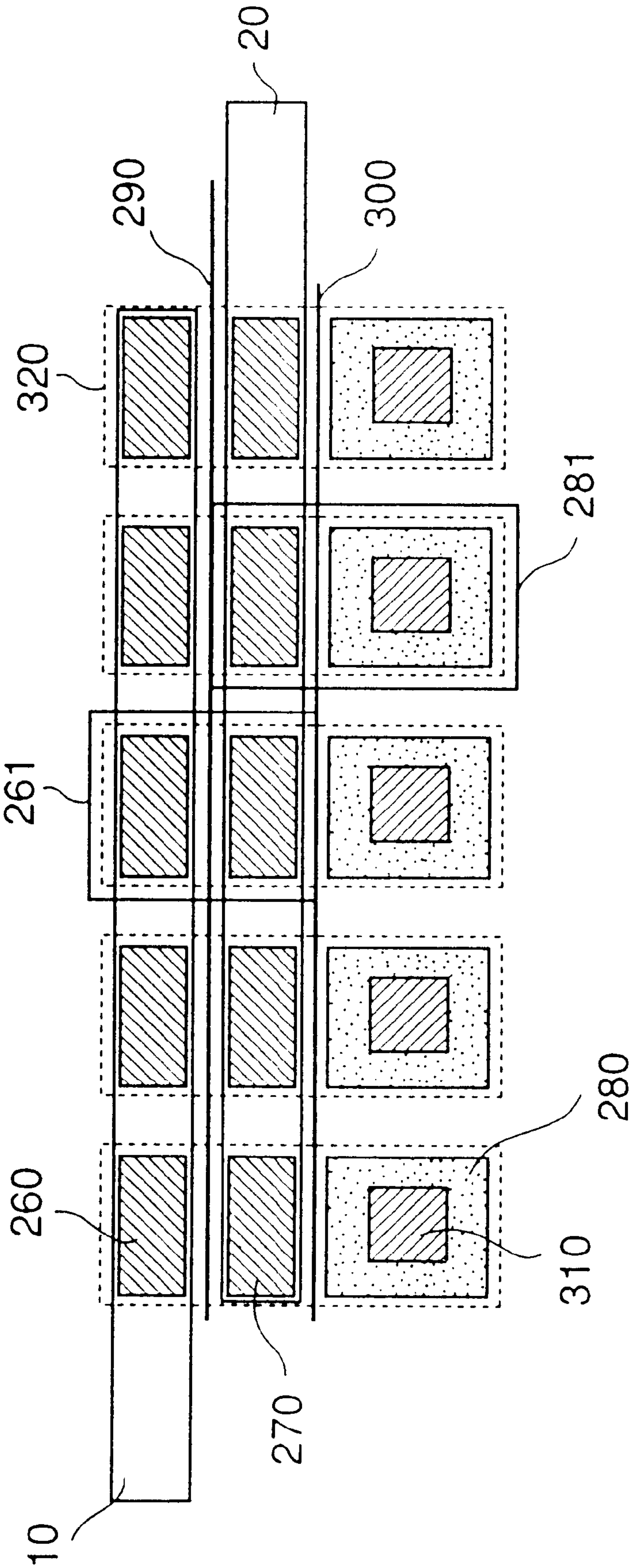
FIG. 7 is a top view showing a structure of a semiconductor device according to the fifth preferred embodiment under the present invention.

FIG. 7 is a top view showing a structure of a semiconductor device according to the fifth preferred embodiment under the present invention.

As shown in FIG. 7, a semiconductor device of the fifth preferred embodiment under the present invention has a structure wherein two pieces of FET 261 and FET 281 having a gate electrode and a pair of ohmic electrodes pinching the above gate electrode and facing to each other is made into a incremental circuit, and a desired number of the above incremental circuits are arranged. A first FET 261 and a second FET 281 structuring a incremental circuit are surrounded by an active layer 320, and they use a second ohmic electrode as a shared electrode 270. And the first ohmic electrode of the second FET 281 is grounded by a bia hole 310. Two pairs of FET 261 and FET 281 structuring a incremental circuit may be described as a concentrated constant.

Neighboring incremental circuits are arranged at certain intervals and so that gate electrodes should be in a straight line. And ohmic electrodes corresponding to neighboring incremental circuits are connected with lines that have an identical characteristic impedance. Namely, in FIG. 7, the first ohmic electrode 260 of the first FET 261 is connected by a line, and one end of the line is made as a first input/output terminal 10. And a shared electrode 270 is connected by a separate line, and the end of the line in the opposite direction to the first input/output terminal 10 is made as a second input/output terminal 20.

In the present preferred embodiment, the length including the first ohmic electrode 260 of the first FET 261, and the length of the shared electrode 270 are set to over at least 1/16 of the propagation wavelength of used microwave or millimeter-wave.

Figure 8:
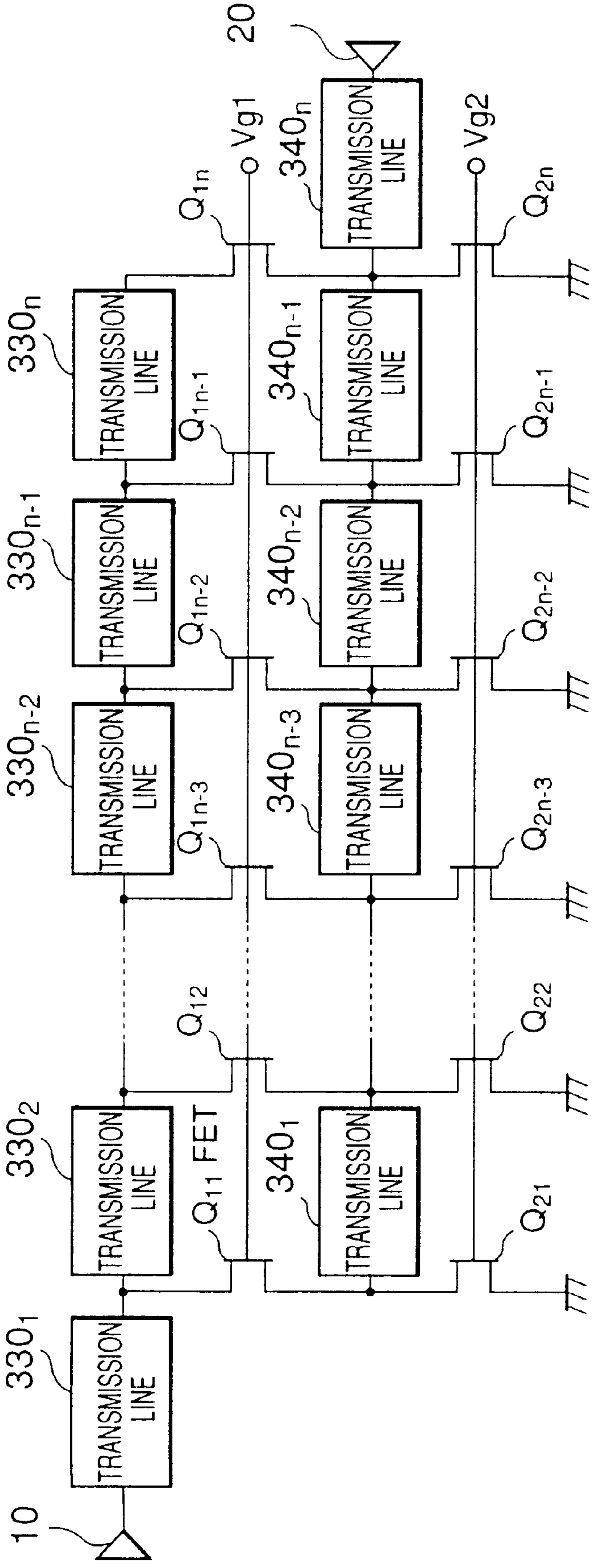
FIG. 8 is a top view showing a structure of a semiconductor device according to the sixth preferred embodiment under the present invention.

FIG. 8 is a top view showing a structure of a semiconductor device according to the sixth preferred embodiment under the present invention. As shown in this FIG. 8, in the equivalent circuit of this semiconductor device, the number n of transmission lines 330 whose characteristic impedance is Z and length is L are connected in serial to an input/output terminal 10, and the number n of transmission lines 340 whose characteristic impedance is Z and length is L are connected in serial to an input/output terminal 20. And among the transmission lines 330, to the common connection points between neighboring transmission lines 330, connected are corresponding number of drains (or sources) of FETs among the number n of FET Q. In the same manner, among the transmission lines 340, to the common connection points between neighboring transmission lines 340, connected are corresponding number of sources (or drains) of FETs among the number n of FET Q, and further corresponding number of drains of FET Q among the number n of FET Q whose sources are grounded are connected.

And, each of the number n of gates of FET $Q_{11}$ through $Q_{1n}$ arranged between the common connection points between the transmission lines 330 and the common connection points between the transmission lines 340 is connected by the gate electrode 290 of the first FET 261, and is made into the same gate electric potential Vg1. In the same manner, each of the number n of gates of FET $Q_{21}$ through $Q_{2n}$ that are connected to common connection points between the transmission lines 340 and grounded is connected by the gate electrode 300 of the second FET 281, and made into the same gate electric potential Vg2. And the total length of the transmission line 330 is set to be longer than 1/16 of propagation wavelength of signals that are input and output to and from the first input/output terminal 10. In the same manner, the total length of the transmission lines 340 is set to be longer than 1/16 of propagation wavelength of signals that are input and output to and from the second input/output terminal 20.

Namely, the equivalent circuit of the semiconductor device shown in FIG. 8 has a structure having plural units of FET $Q_{1k}$ (wherein k is an optional value from 1 to n), and transmission line $\mathbf{330}_k$ whose one end is connected to the source of the FET $Q_{1k}$ concerned, transmission line $\mathbf{340}_k$ whose one end is connected to the drain of FET $Q_{1k}$, and FET $Q_{2k}$ whose source is grounded and whose drain is connected to the drain of FET $Q_{1k}$ and one end of the transmission line $\mathbf{340}_k$.

In the equivalent circuit structured as shown above, when FET $Q_{11}$ through $Q_{1n}$ are turned ON by the gate electric potential Vg1, and FET $Q_{21}$ through $Q_{2n}$ are turned OFF by the gate electric potential Vg2, electric power goes from the first input/output terminal 10 via transmission lines 330 and 340 to the second input/output terminal 20, and thereby the switch circuit gets ON. On the contrary, when FET $Q_{11}$ through $Q_{1n}$ are turned OFF by the gate electric potential Vg1, and FET $Q_{21}$ through $Q_{2n}$ are turned ON by the gate electric potential Vg2, electric power from the first input/output terminal 10 to the second input/output terminal 20 is shut off, as a result, the switch circuit gets OFF. And as known in the comparison of FIG. 7 and FIG. 8, the first ohmic electrode 260 and shared electrode 270 of FET $Q_{11}$ through $Q_{1n}$ have also a function as a distributed-constant line.

Figure 9:
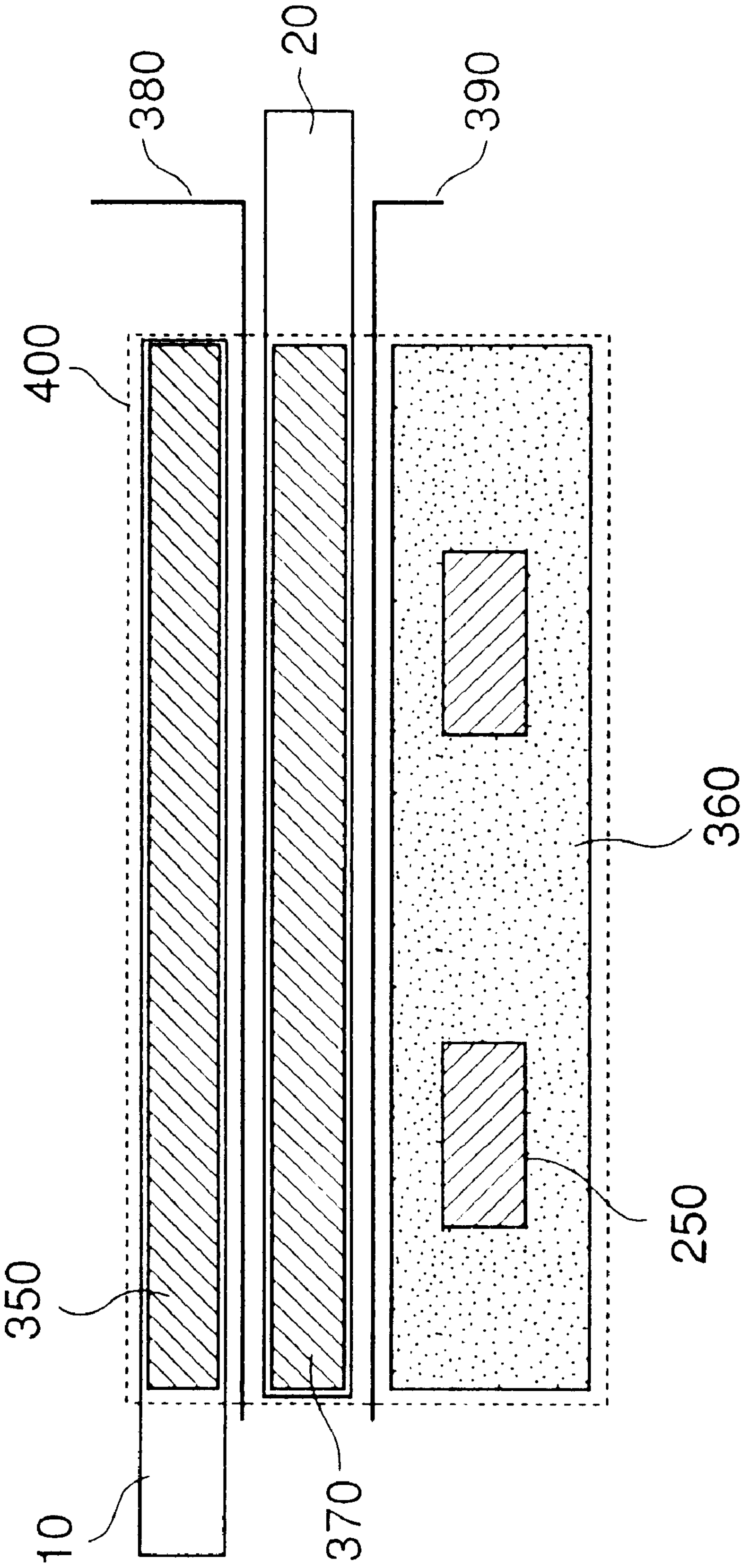
FIG. 9 is a diagram showing an equivalent circuit in the fifth and sixth preferred embodiments under the present invention.

FIG. 9 is a diagram showing an equivalent circuit in the fifth and sixth preferred embodiments under the present invention.

As shown in this FIG. 9, the semiconductor device of the sixth preferred embodiment under the present invention has a gate electrode and 2 units of FET having a pair of ohmic electrodes pinching the gate electrode and facing to each other and covered with an active layer 400. Among the above 2 units of FET, the one end in longer direction of the first ohmic electrode 350 of the first FET is set as a first input/output terminal 10 that outputs and inputs signals of microwave or millimeter-wave. And the first ohmic electrode 360 of the second FET is grounded via a bia hole 250. And further, the second ohmic electrode of the first FET and the second ohmic electrode of the second FET are set as a shared electrode 370. And the opposite end to the first input/output terminal 10 in the shared electrode 370 is set as a second input/output terminal 20 that outputs and inputs signals of microwave or millimeter-wave.

And a gate electrode 380 is formed between the first ohmic electrode 350 of the first FET and the shared electrode 370, and a gate electrode 390 is formed between the shared electrode 370 and the first ohmic electrode 360 of the second FET. That is, this preferred embodiment corresponds to the composition whose number of incremental elements in the fifth preferred embodiment is infinite.

In the sixth preferred embodiment, the length of gate electrode 380 of the first FET and the length of the gate electrode 390 of the second FET inside of the active layer 400, the length of the ohmic electrode 350 in the first FET, the length of the shared electrode 370, and the length of the first ohmic electrode 360 of the second FET are set to be over at least 1/16 of the propagation wavelength of used microwave or millimeter-wave. Thereby, the equivalent circuit diagram of the semiconductor device of the sixth preferred embodiment shown in FIG. 6 becomes substantially same as the equivalent circuit diagram of the semiconductor device of the fifth preferred embodiment shown in FIG. 7, and acts as same as the fifth preferred embodiment.

Figure 10:
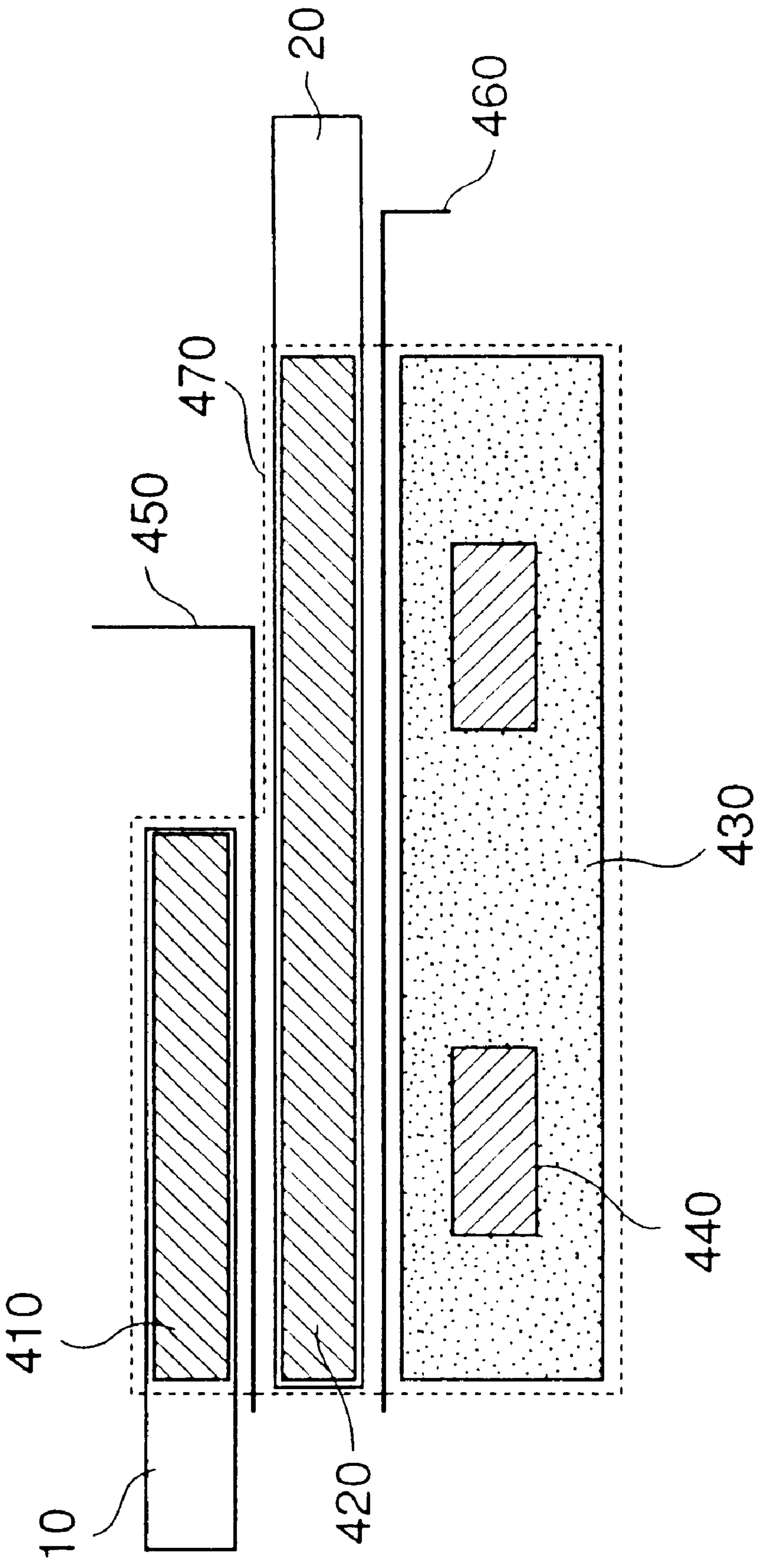
FIG. 10 is a top view showing a structure of a semiconductor device according to the seventh preferred embodiment under the present invention.

FIG. 10 is a top view showing a structure of a semiconductor device according to the seventh preferred embodiment under the present invention.

As shown in this FIG. 10, the semiconductor device of the seventh preferred embodiment under the present invention has a gate electrode and 2 units of FET having a pair of ohmic electrodes pinching the gate electrode and facing to each other and covered with an active layer 470. Among the above 2 units of FET, the one end in longer direction of the first ohmic electrode 410 of the first FET is set as a first input/output terminal 10 that outputs and inputs signals of microwave or millimeter-wave. And the first ohmic electrode 430 of the second FET is grounded via a bia hole 440. And further, the second ohmic electrode of the first FET and the second ohmic electrode of the second FET are set as a shared electrode 420. And the opposite end to the first input/output terminal 10 in the shared electrode 420 is set as a second input/output terminal 20 that outputs and inputs signals of microwave or millimeter-wave. In the seventh preferred embodiment, as shown in the figure, the length of the gate electrode 450 of the first FET differs from that of the gate electrode 460 of the second FET.

And a gate electrode 450 is formed between the first ohmic electrode 410 of the first FET and the shared electrode 420, and further a gate electrode 460 is formed between the shared electrode 420 and the first ohmic electrode 430 of the second FET.

In the seventh preferred embodiment, as mentioned above, the length of the gate electrode 450 of the first FET inside of the active layer 470 differs from that of the gate electrode 460 of the second FET. And the length of the gate electrode 460 of the second FET inside of the active layer 470, the length of the shared electrode 420, and the length of the first ohmic electrode 430 of the second FET are set to be longer than at least 1/16 of the propagation wavelength of used microwave or millimeter-wave. However, the length of the gate electrode 450 of the first FET inside of the active layer 470 and the length of the first ohmic electrode 410 of the first FET may be not limited to 1/16 of the propagation wavelength of used microwave or millimeter-wave. And to the contrary to this preferred embodiment, the gate width of the first FET may be wider than the gate width of the second FET, and accordingly the length of the first ohmic electrode of the first FET may be longer than the length of the first ohmic electrode of the second FET.

Figure 11:
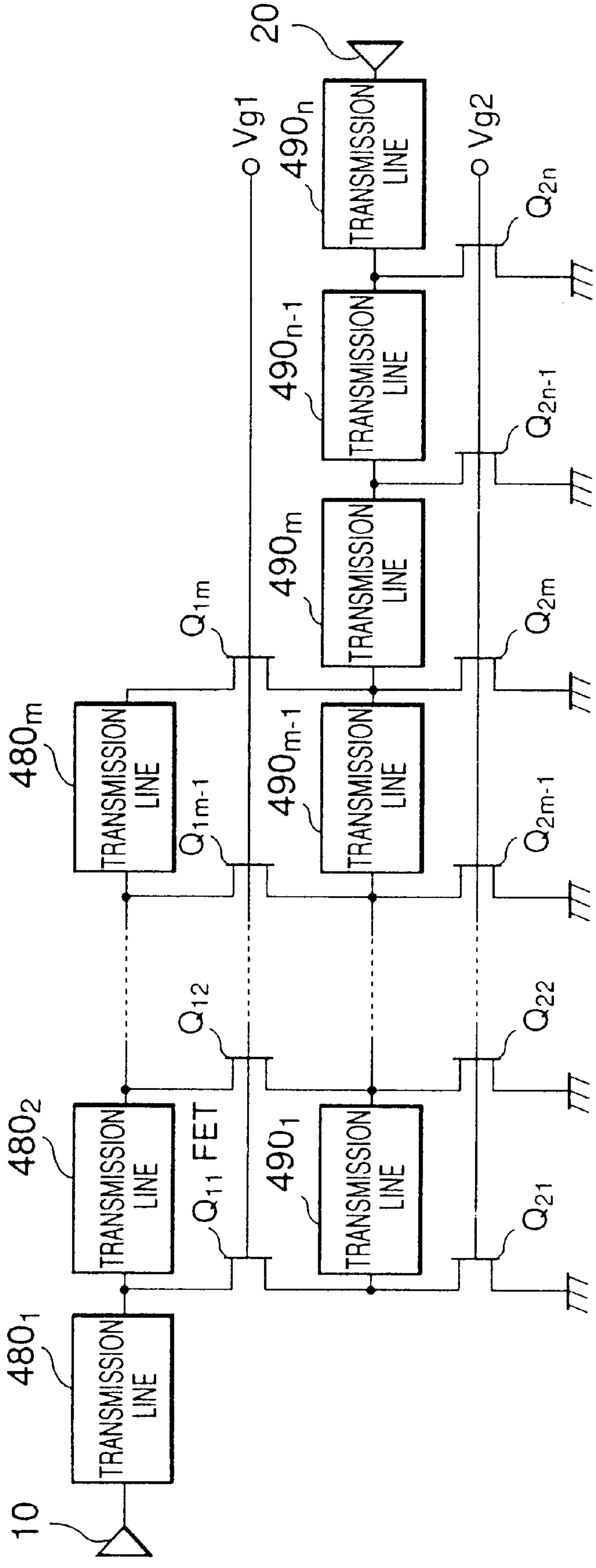
FIG. 11 is a diagram showing an equivalent circuit in the seventh preferred embodiment under the present invention.

FIG. 11 is a diagram showing an equivalent circuit in the seventh preferred embodiment under the present invention. As shown in this FIG. 11, in the equivalent circuit of this semiconductor device, the number m of transmission lines 480 whose characteristic impedance is Z and length is L are connected in serial to the first input/output terminal 10, and the number n (provided, n>m in the present preferred embodiment) of transmission lines 490 whose characteristic impedance is Z and length is L are connected in serial to the second input/output terminal 20. And among the transmission lines 480, to the common connection points between neighboring transmission lines 480, connected are corresponding number of drains (or sources) of FETs among the number n of FET Q. In the same manner, among the transmission lines 490, to the common connection points between neighboring transmission lines 490, connected are corresponding number of sources (or drains) of FETs among the number m of FET Q, and further corresponding number of drains of FET Q among the number n of FET Q whose sources are grounded are connected.

And, each of the number m of gates of FET arranged between the common connection points between the transmission lines 480 and the common connection points between the transmission lines 490 is connected by the gate electrode 450 of the first FET, and is made into the same gate electric potential Vg1. In the same manner, each of the number n of gates of FET Q that are connected to common connection points between the transmission lines 490 and grounded is connected by the gate electrode 460 of the second FET, and made into the same gate electric potential Vg2. And the total length of the transmission line 490 is set to be longer than 1/16 of propagation wavelength of signals that are input and output to and from the first input/output terminal 10. In the same manner, the total length of the transmission lines 340 is set to be longer than 1/16 of propagation wavelength of used microwave or millimeter-wave.

In the equivalent circuit structured as shown above, when FET $Q_{11}$ through $Q_{1m}$ are turned ON by the gate electric potential Vg1, and FET $Q_{21}$ through $Q_{2n}$ are turned OFF by the gate electric potential Vg2, electric power goes from the first input/output terminal 10 to the second input/output terminal 20, and thereby the switch circuit gets ON. On the contrary, when FET $Q_{11}$ through $Q_{1m}$ are turned OFF by the gate electric potential Vg1, and FET $Q_{21}$ through $Q_{2n}$ are turned ON by the gate electric potential Vg2, electric power from the first input/output terminal 10 to the second input/output terminal 20 is shut off, as a consequence, the switch circuit gets OFF. And as known in the comparison of FIG. 10 and FIG. 11, the shared electrode 420 has also a function as a distributed-constant line.

Figure 12:
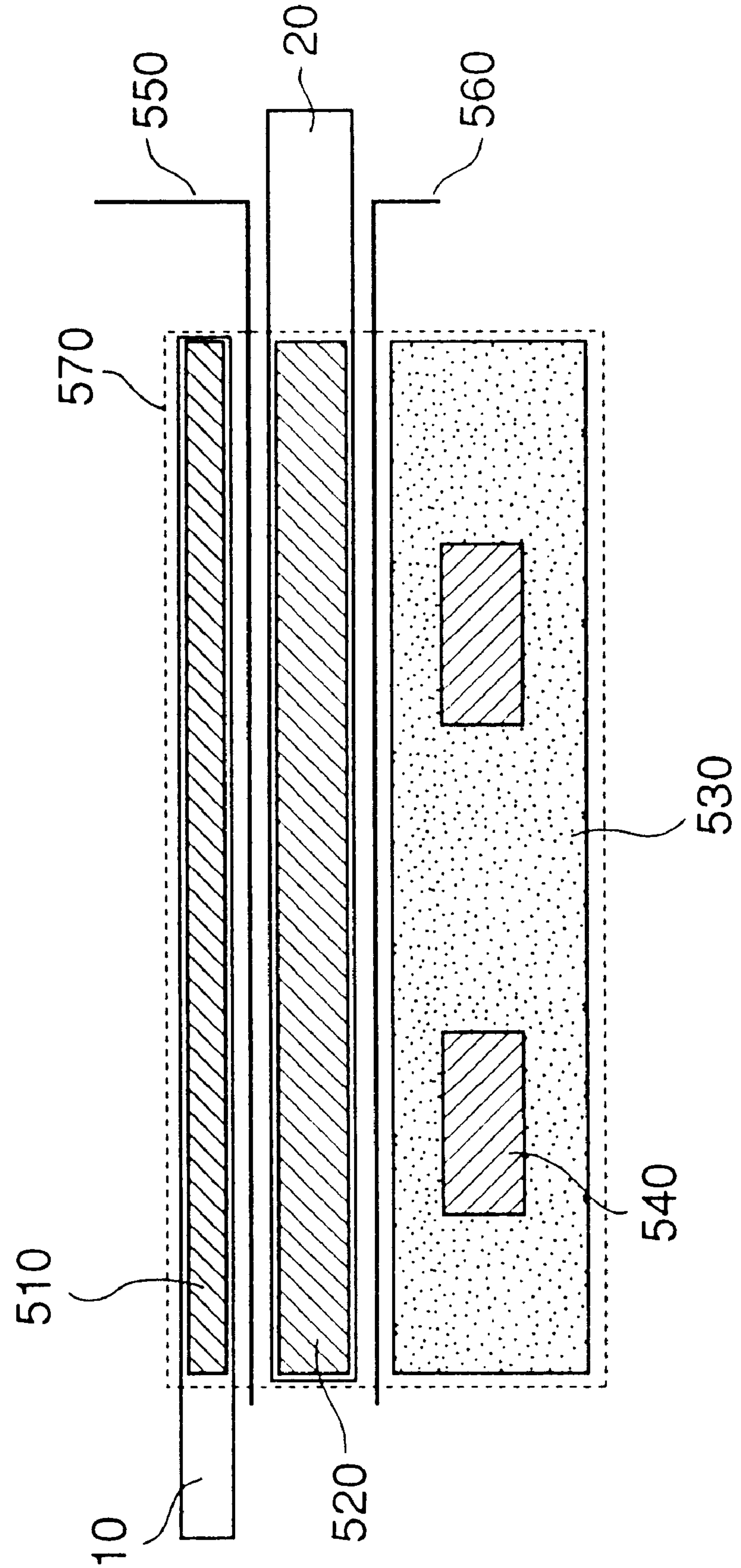
FIG. 12 is a top view showing a structure of a semiconductor device according to the eighth preferred embodiment under the present invention.

FIG. 12 is a top view showing a structure of a semiconductor device according to the eighth preferred embodiment under the present invention.

As shown in this FIG. 12, the semiconductor device of the eighth preferred embodiment under the present invention has a gate electrode and 2 units of FET having a pair of ohmic electrodes pinching the gate electrode and facing to each other and covered with an active layer 570. Among the above 2 units of FET, the one end in longer direction of the first ohmic electrode 510 of the first FET is set as a first input/output terminal 10 that outputs and inputs signals of microwave or millimeter-wave. And the first ohmic electrode 530 of the second FET is grounded via a bia hole 540. And further, the second ohmic electrode of the first FET and the second ohmic electrode of the second FET are set as a shared electrode 520. And the opposite end to the first input/output terminal 10 in the shared electrode 520 is set as a second input/output terminal 20 that outputs and inputs signals of microwave or millimeter-wave. In the seventh preferred embodiment, as shown in the figure, the length of the gate electrode 450 of the first FET differs from that of the gate electrode 460 of the second FET.

As shown in this FIG. 12, the semiconductor device of the eighth preferred embodiment under the present invention has a gate electrode and 2 units of FET having a pair of ohmic electrodes pinching the gate electrode and facing to each other and covered with an active layer 570. Among the above 2 units of FET, the one end in longer direction of the first ohmic electrode 510 of the first FET is set as a first input/output terminal 10 that outputs and inputs signals of microwave or millimeter-wave. And the first ohmic electrode 530 of the second FET is grounded via a bia hole 540. And further, the second ohmic electrode of the first FET and the second ohmic electrode of the second FET are set as a shared electrode 520. And the opposite end to the first input/output terminal 10 in the shared electrode 520 is set as a second input/output terminal 20 that outputs and inputs signals of microwave or millimeter-wave. In the eighth preferred embodiment, as shown in the figure, the width of the gate electrode 450 of the first FET differs from that of the gate electrode 460 of the second FET.

And a gate electrode 550 is formed between the first ohmic electrode 510 of the first FET and the shared electrode

520, and further a gate electrode 560 is formed between the shared electrode 520 and the first ohmic electrode 530 of the second FET.

In the eighth preferred embodiment, as mentioned above, the width of the first ohmic electrode 510 of the first FET differs from that of the shared electrode 520. And the length of the gate electrode 560 of the first FET and the gate electrode 560 of the second FET inside of the active layer 57, the length of the shared electrode 520, and the length of the first ohmic electrode 530 of the second FET are set to be longer than at least 1/16 of the propagation wavelength of used microwave or millimeter-wave.

Figure 13:
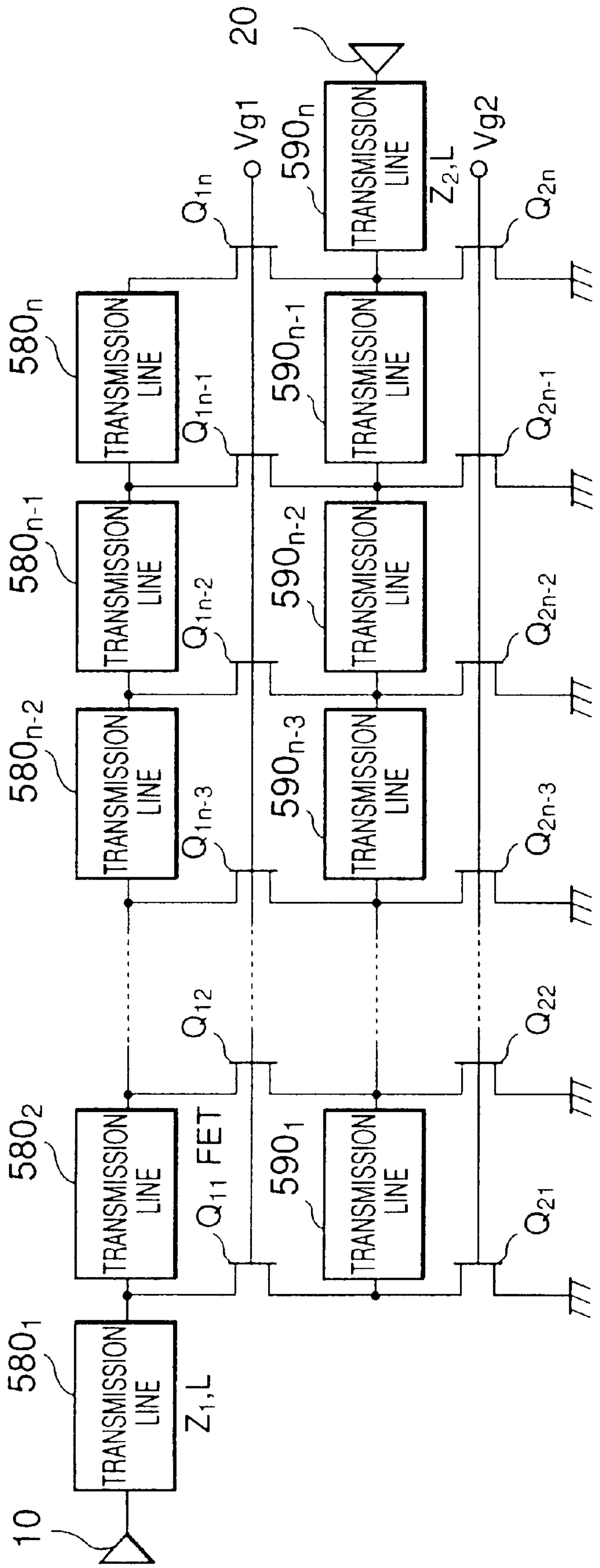
FIG. 13 is a diagram showing an equivalent circuit in the eighth preferred embodiment under the present invention.

FIG. 13 is a diagram showing an equivalent circuit in the eighth preferred embodiment under the present invention. As shown in this FIG. 13, in the equivalent circuit of this semiconductor device, the number n of transmission lines 580 whose characteristic impedance is Z1 and length is L are connected in serial to the first input/output terminal 10, and the number n of transmission lines 590 whose characteristic impedance is Z2 (≠Z1) and length is L are connected in serial to the second input/output terminal 20. And among the transmission lines 580, to the common connection points between neighboring transmission lines 580, connected are corresponding number of drains (or sources) of FETs among the number n of FET Q. In the same manner, among the transmission lines 590, to the common connection points between neighboring transmission lines 590, connected are corresponding number of sources (or drains) of FETs among the number n of FET Q, and further corresponding number of drains of FET Q among the number n of FET Q whose sources are grounded are connected.

And, each of the number n of gates of FET arranged between the common connection points between the transmission lines 580 and the common connection points between the transmission lines 590 is connected by the gate electrode 550 of the first FET, and is made into the same gate electric potential Vg1. In the same manner, each of the number n of gates of FET Q that are connected to common connection points between the transmission lines 590 and grounded is connected by the gate electrode 560 of the second FET, and made into the same gate electric potential Vg2.

In the equivalent circuit structured as shown above, when FET $Q_{11}$ through $Q_{1n}$ are turned ON by the gate electric potential Vg1, and FET $Q_{21}$ through $Q_{2n}$ are turned OFF by the gate electric potential Vg2, electric power goes from the first input/output terminal 10 via the transmission lines 580 and 590 to the second input/output terminal 20, and thereby the serial-parallel switch circuit gets ON. On the contrary, when FET $Q_{11}$ through $Q_{1n}$ are turned OFF by the gate electric potential Vg1, and FET $Q_{21}$ through $Q_{2n}$ are turned ON by the gate electric potential Vg2, electric power from the first input/output terminal 10 to the second input/output terminal 20 is shut off, as a consequence, the serial-parallel switch circuit gets OFF. And as known in the comparison of FIG. 12 and FIG. 13, the ohmic electrode 510 of FET $Q_{11}$ through $Q_{1n}$ and the shared electrode 420 have also a function as a distributed-constant line.

In the next place, the transparent characteristics in the actual action of each of the above preferred embodiments are explained hereinafter.

In the first preferred embodiment shown in FIG. 1, a GaAlAs system hetero connection FET was used as a semiconductor substrate, and 10 pieces of FET whose gate length was 0.15 μm and the length of its gate electrode inside of the active layer 30 was 100 μm was used. The width of ohmic electrodes 40 and 60 was 38.2 μm, and 50 Ω impedances were connected to the first input/output terminal 10 and the second input/output terminal 20. And in order to make the gate bias circuit into a high impedance, 2 k Ω resistance element using epitaxial layer was inserted into the line between the gate electrode and the gate bias. The interval between incremental circuits was 1 μm.

Figure 14:
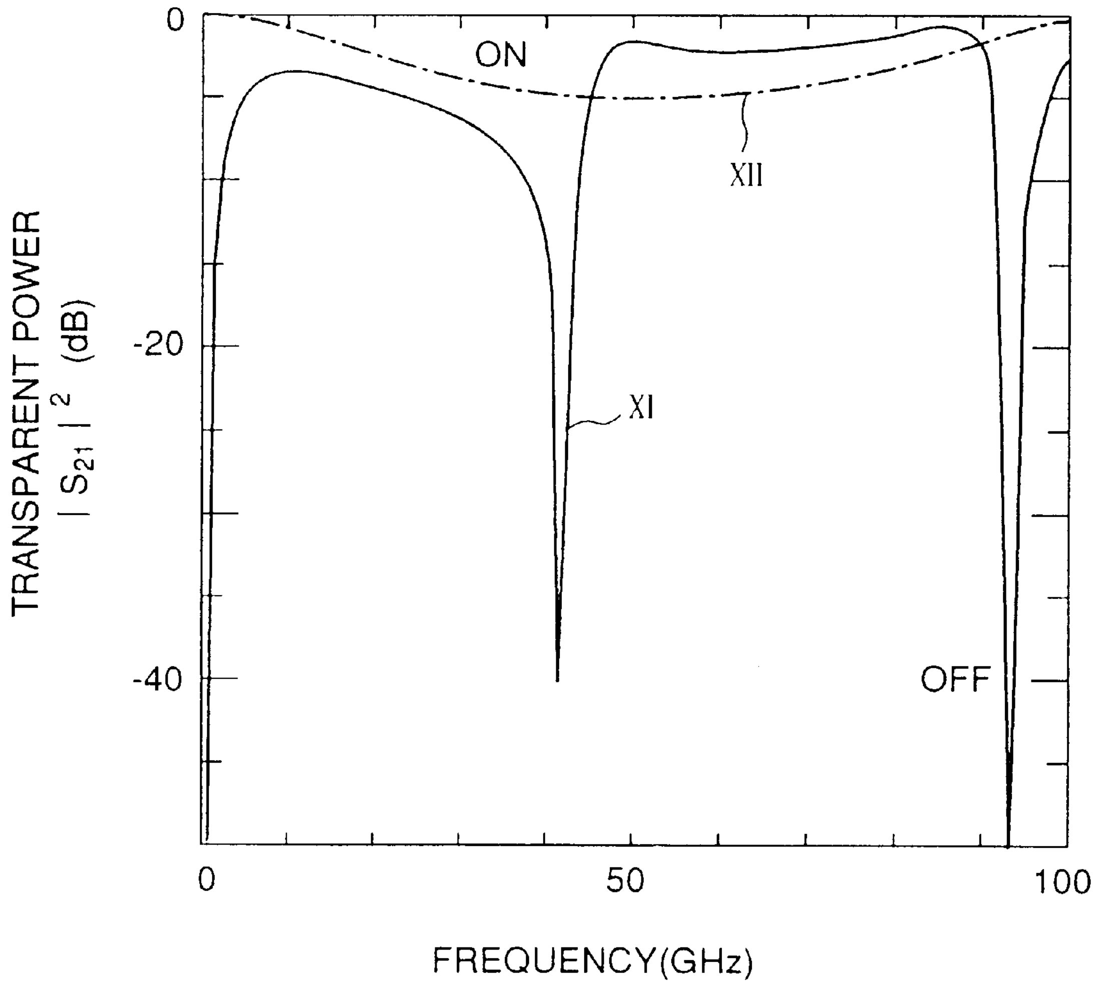
FIG. 14 is a diagram showing transparent characteristics of the first and second preferred embodiments under the present invention.

FIG. 14 shows the transparent characteristics in the ON status and the OFF status of the semiconductor device of the first preferred embodiment under the present invention. In this FIG. 14, the vertical axis shows the transparent power $|S_{21}|^2$ between the first input/output terminal 10 and the second input/output terminal 20, while the horizontal axis shows the frequency of input signals. The above is true to the respective transparent characteristics diagrams shown in FIG. 15 throughout FIG. 18.

Figure 20:
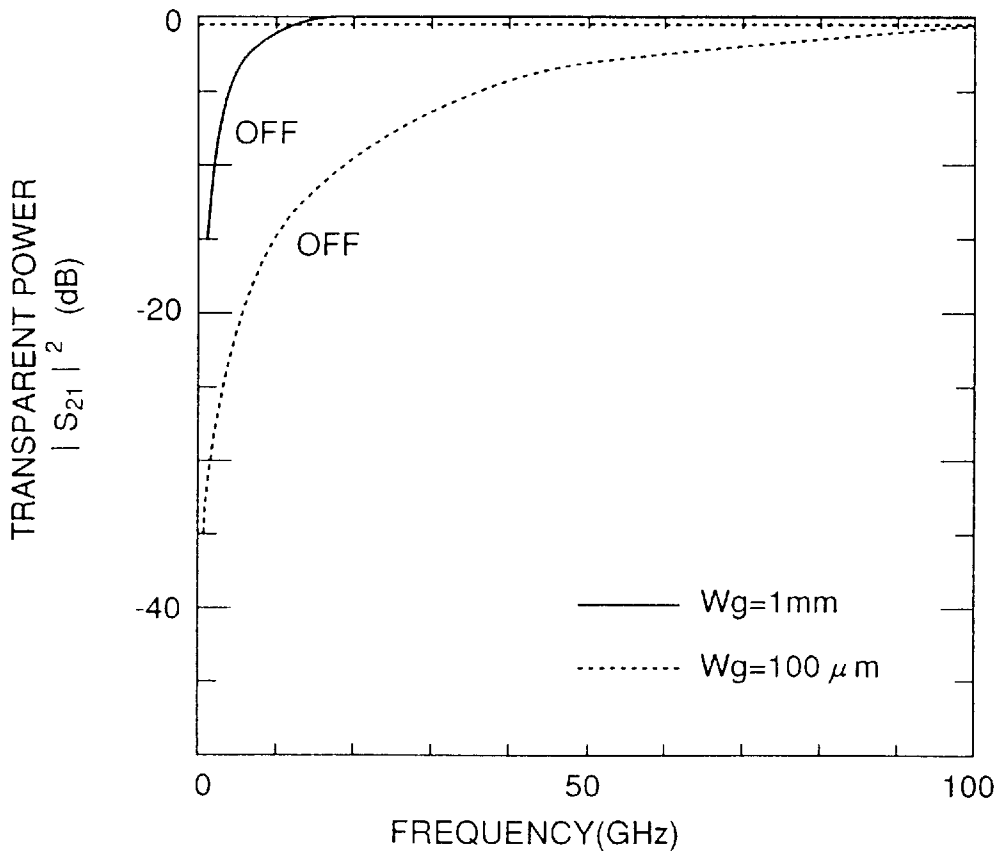
FIG. 20 is a diagram showing transparent characteristics of a conventional serial structure switch.
Figure 21:
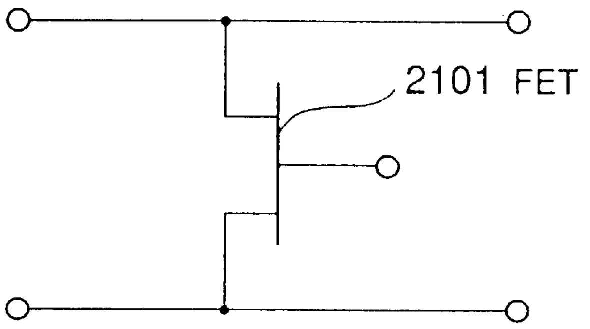
FIG.21 (PRIOR ART)
FIG. 21 is a circuit diagram showing a structure of a conventional parallel structure switch.

In a conventional device shown in FIG. 20, isolation as the power breaking capacity at turning OFF the switch decreased greatly as the frequency increased, on the contrary, in the first preferred embodiment according to the present invention, as shown by the solid line XI in FIG. 14, sharp and large isolation was attained at desired frequency. And with respect to insertion loss as the power loss amount at turning the switch OFF, as shown by the dashed line XII, a few characteristics was obtained in wide frequency. Therefore, according to this preferred embodiment, it was possible to attain large power transmission, low insertion loss, and high isolation at the same time, which has so far never been realized.

For information, with respect to the characteristics at 94 GHz, the conventional device attained insertion loss −0.014 dB and isolation 0.069 dB, on the other hand, the first preferred embodiment attained insertion loss −1.83 dB and isolation −58.5 dB, thus characteristics have been improved to a great extent.

Then, explanation is made on the second preferred embodiment shown in FIG. 3.

In the second preferred embodiment shown in FIG. 3, a GaAlAs system hetero connection FET was used as a semiconductor substrate, and 10 pieces of FET whose gate length was 0.15 μm and the length of its gate electrode inside of the active layer 30 was 500 μm was used. The width of ohmic electrodes 120 and 130 was 38.2 μm, and 50 Ω impedances were connected to the first input/output terminal 10 and the second input/output terminal 20. And in order to make the gate bias circuit into a high impedance, 2 k Ω resistance element using epitaxial layer was inserted into the line between the gate electrode and the gate bias.

The transparent characteristics in the ON status and the OFF status of the semiconductor device of the second preferred embodiment under the present invention appeared same as the transparent characteristics shown in FIG. 14, and the second preferred embodiment attained insertion loss −1.83 dB and isolation −58.5 dB at 94 GHz, thus characteristics have been improved to a great extent.

Next, explanation is made on the third preferred embodiment shown in FIG. 4.

In the third preferred embodiment shown in FIG. 4, a GaAlAs system hetero connection FET was used as a semiconductor substrate, and 10 pieces of FET whose gate length was 0.15 μm and the length of the gate electrode 140 inside of the active layer 180 was 100 μm was used. The width of ohmic electrodes 160 was 20 μm, and 50 Ω impedances were connected to the first input/output terminal 10 and the second input/output terminal 20. And in order to make the gate bias circuit into a high impedance, 2 k Ω resistance element using epitaxial layer was inserted into the line between the gate electrode and the gate bias. The interval between incremental circuits was 1 μm.

Figure 15:
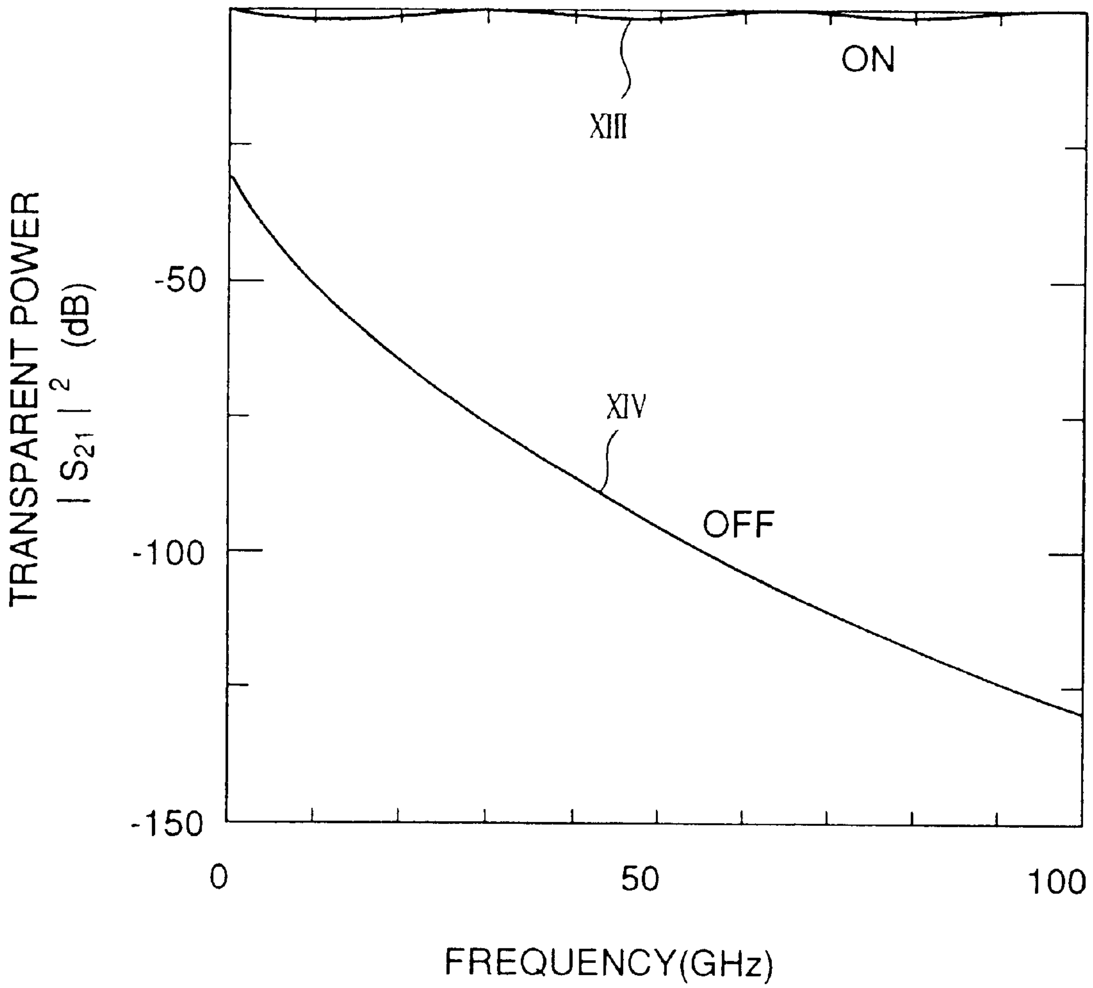
FIG. 15 is a diagram showing transparent characteristics of the third and fourth preferred embodiments under the present invention.

FIG. 15 shows the transparent characteristics in the ON status and the OFF status of the semiconductor device of the third preferred embodiment under the present invention.

Figure 22:
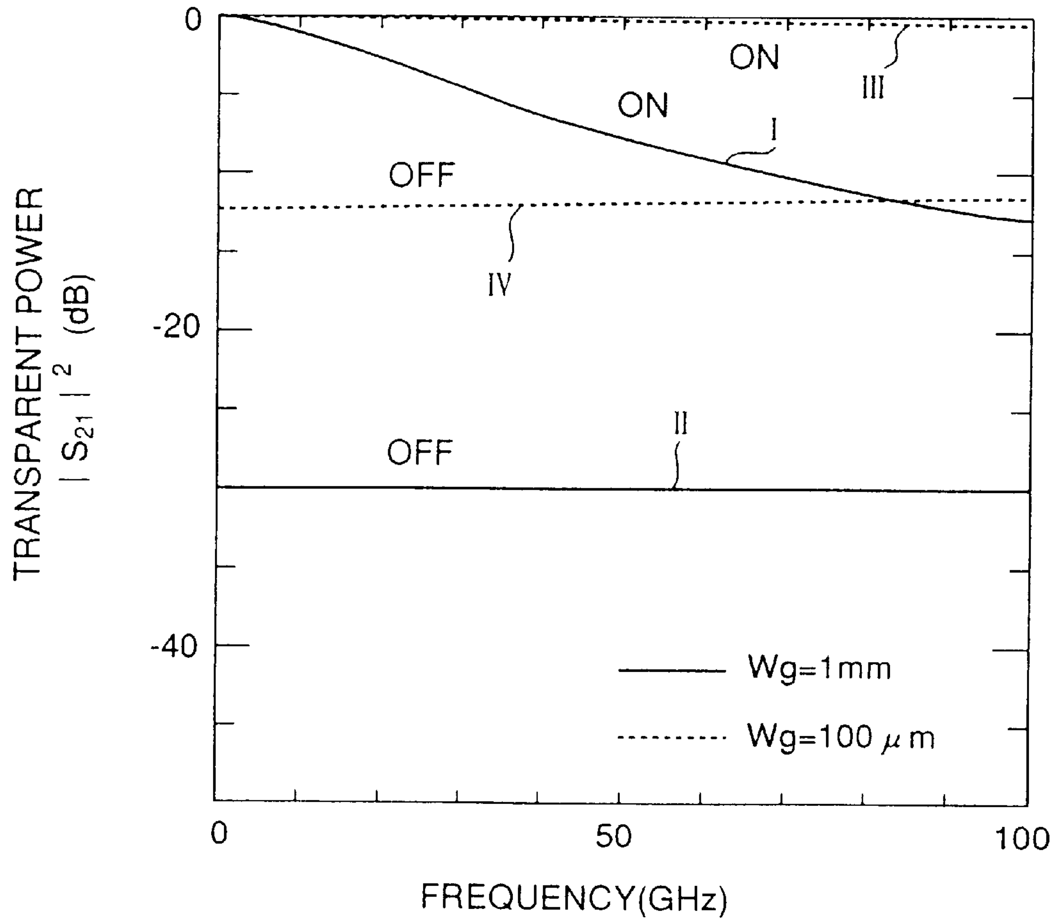
FIG.22 (PRIOR ART)
FIG. 22 is a diagram showing transparent characteristics of a conventional parallel structure switch.
Figure 23:
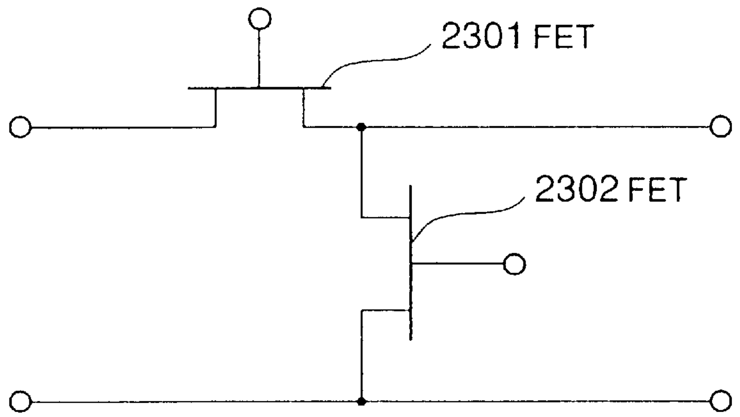
FIG. 23 (PRIOR ART)
FIG. 23 is a circuit diagram showing a structure of a conventional serial-parallel structure switch.

In a conventional device shown in FIG. 22, isolation loss increased greatly as the frequency increased, on the contrary, in the third preferred embodiment according to the present invention, as shown by the dashed line XIII in FIG. 15, isolation loss did not increase though there were seen vibration around 0 dB in accompany with changes in frequency. This comes from the same reason for that a cosine trigonometric function is included in the equation (1) to obtain the abovementioned transparent characteristics $|S_{21}|^2$.

In a conventional device shown in FIG. 22, isolation was constant irrespective of frequency, on the other hand, in the third preferred embodiment according to the present invention, as shown by the solid line XIV in FIG. 15, isolation increased as frequency became high. Therefore, according to the third preferred embodiment, it was possible to attain large power transmission, low insertion loss, and high isolation at the same time, which has so far never been realized.

For information, with respect to the characteristics at 60 GHz, the conventional device attained insertion loss −9.54 dB and isolation −30.17 dB, on the other hand, the third preferred embodiment attained insertion loss −0.098 dB and isolation −103.1 dB, thus characteristics have been improved to a great extent.

Then, explanation is made on the fourth preferred embodiment shown in FIG. 6.

In the fourth preferred embodiment shown in FIG. 6, a GaAlAs system hetero connection FET was used as a semiconductor substrate, whose gate length was 0.15 μm and the length of its gate electrode inside of the active layer 240 was 1 mm was used. The width of ohmic electrodes 220 was 20 μm, and 50 Ω impedances were connected to the first input/output terminal 10 and the second input/output terminal 20. And in order to make the gate bias circuit into a high impedance, 2 k Ω resistance element using epitaxial layer was inserted into the line between the gate electrode and the gate bias.

The transparent characteristics in the ON status and the OFF status of the semiconductor device of the fourth preferred embodiment under the present invention appeared same as the transparent characteristics shown in FIG. 15, and the fourth preferred embodiment attained insertion loss −0.098 dB and isolation −103.1 dB at 60 GHz, thus characteristics have been improved to a great extent.

Next, explanation is made on the fifth preferred embodiment shown in FIG. 7.

In the fifth preferred embodiment shown in FIG. 7, a GaAlAs system hetero connection FET was used as a semiconductor substrate, and 20 pieces in total of FET whose gate length was 0.15 μm and the length of the gate electrode inside of the active layer 320 was 100 μm was used in serial and parallel. The width of ohmic electrodes in both the first ohmic electrode 260 of the first FET and the shared electrode 270 was 20 μm, and 50 Ω impedances were connected to the first input/output terminal 10 and the second input/output terminal 20. And in order to make the gate bias circuit into a high impedance, 2 k Ω resistance element using epitaxial layer was inserted into the line between the gate electrode and the gate bias in each FET. The interval between incremental circuits was 1 μm.

Figure 16:
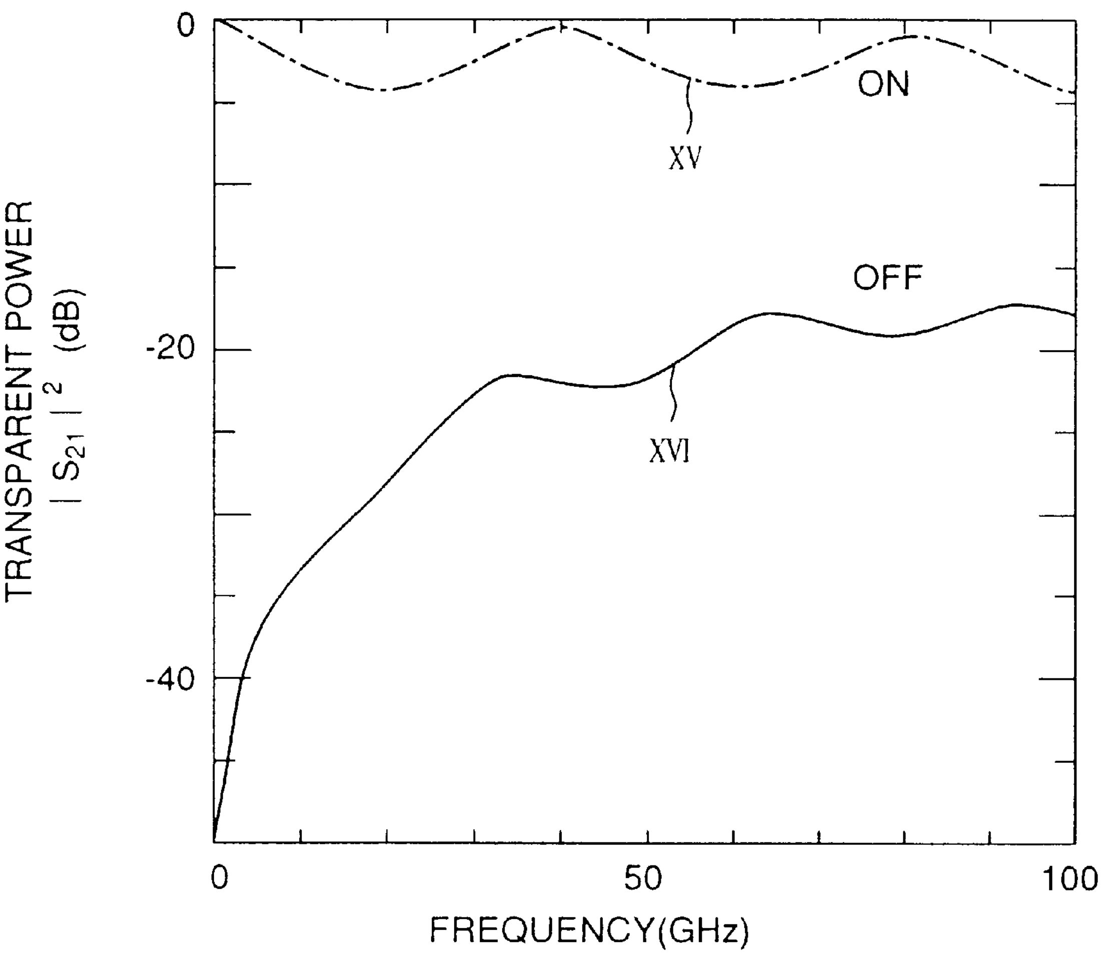
FIG. 16 is a diagram showing transparent characteristics of the fifth and sixth preferred embodiments under the present invention.

FIG. 16 shows the transparent characteristics in the ON status and the OFF status of the semiconductor device of the fifth preferred embodiment under the present invention.

Figure 24:
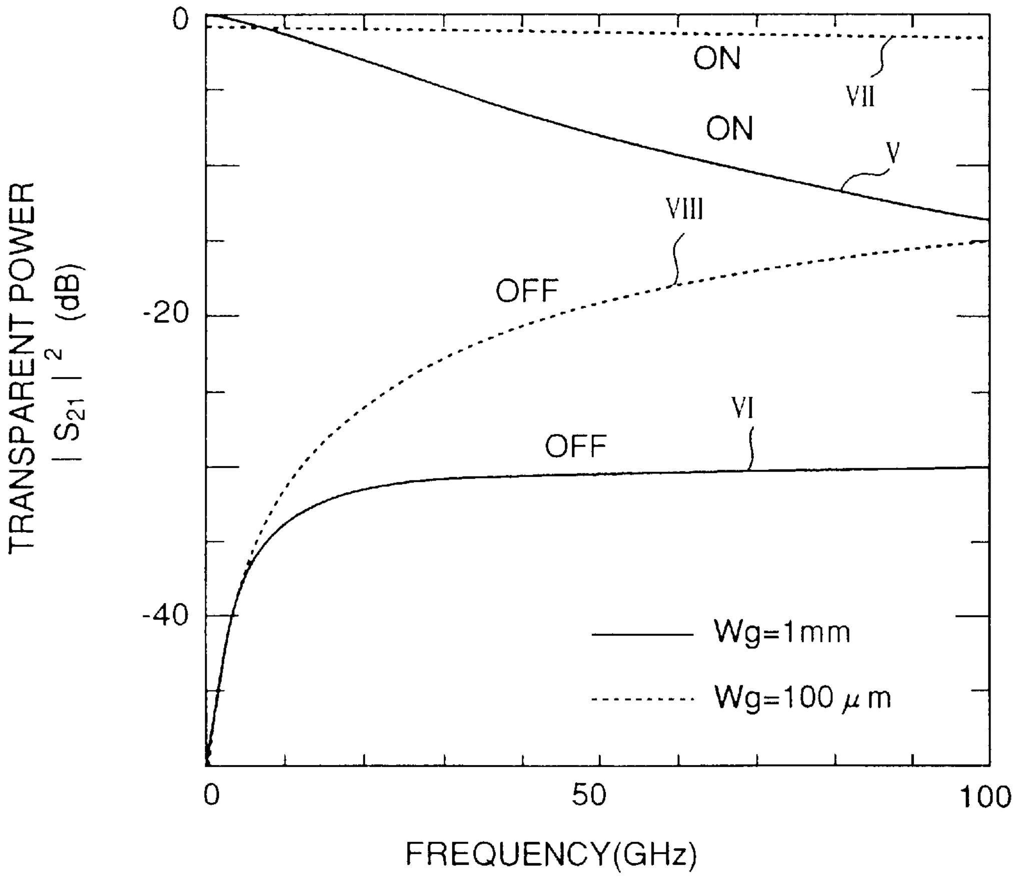
FIG. 24 (PRIOR ART)
FIG. 24 is a diagram showing transparent characteristics of a conventional serial-parallel structure switch.
Figure 25:
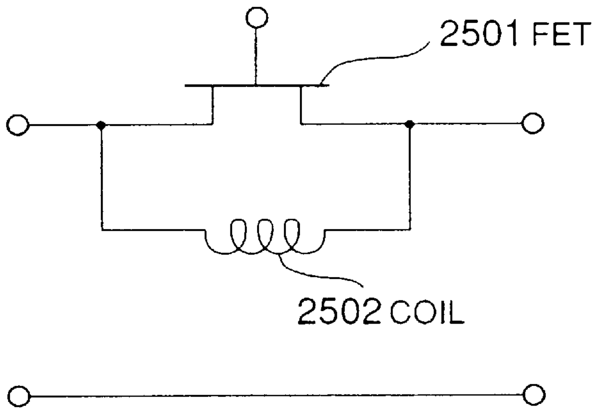
FIG. 25 (PRIOR ART)
FIG. 25 is a circuit diagram showing a structure of a switch comprising a conventional serial FET and a parallel connection coil.
Figure 26:
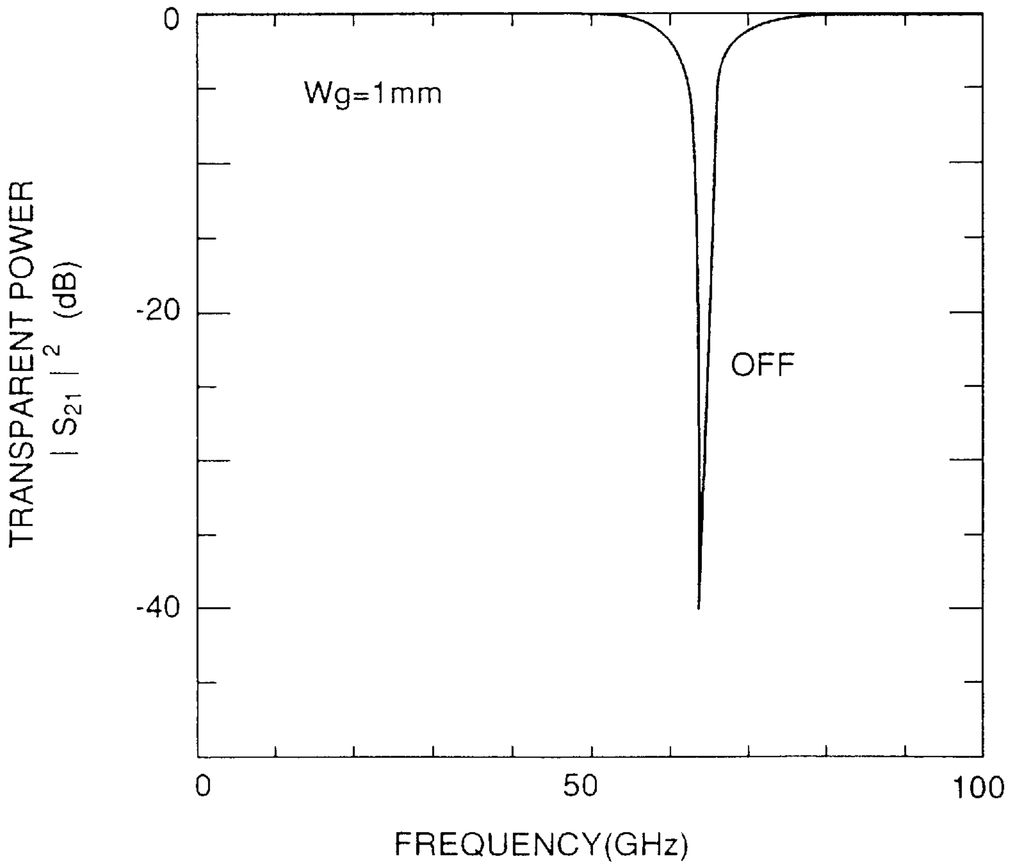
FIG. 26 (PRIOR ART)
FIG. 26 is a diagram showing transparent characteristics of a switch having the structure in FIG. 25.
Figure 27:
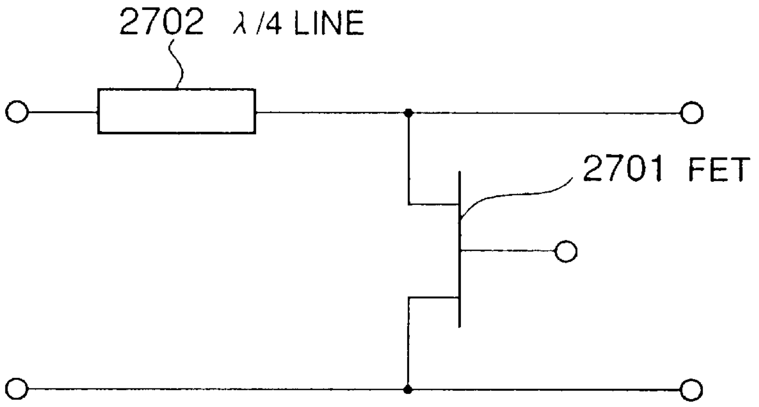
FIG.27 (PRIOR ART)
FIG. 27 is a circuit diagram showing a structure of a switch comprising a conventional parallel FET and a serial $\lambda/4$ line.
Figure 28:
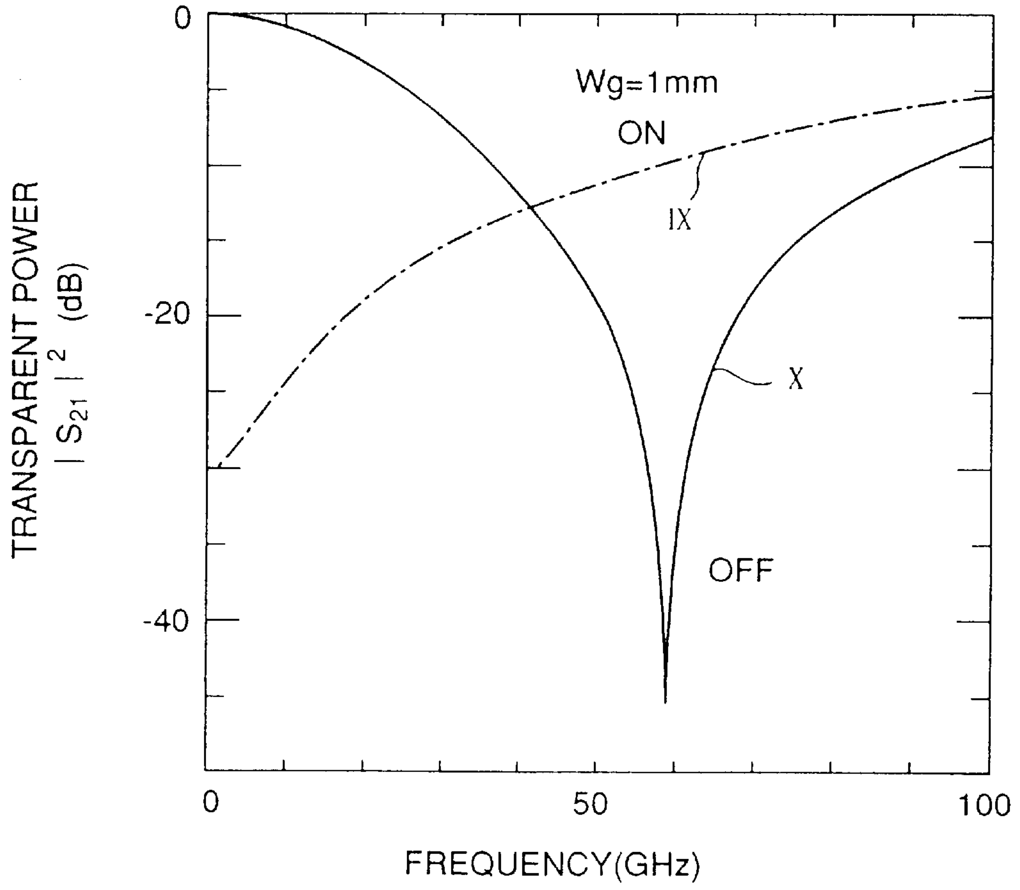
FIG.28 (PRIOR ART)
FIG. 28 is a diagram showing transparent characteristics of a switch having the structure in FIG. 27.
Figure 29:
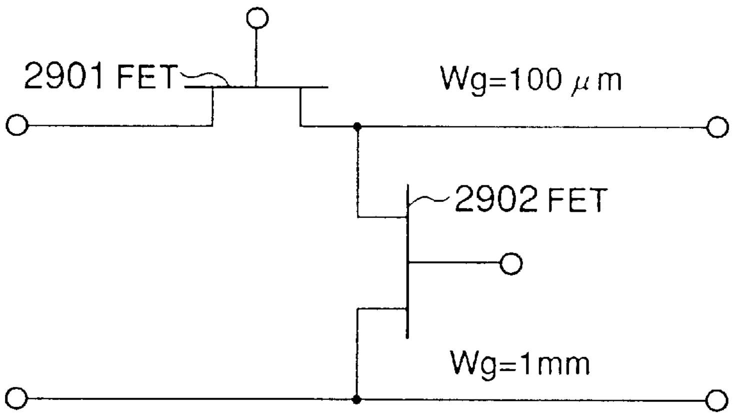
FIG.29 (PRIOR ART)
FIG. 29 is a circuit diagram showing another example of a structure of a conventional serial-parallel structure switch.

In a conventional device shown in FIG. 24, isolation loss increased greatly as the frequency increased, on the contrary, in the fifth preferred embodiment according to the present invention, as shown by the dashed line XV in FIG. 16, isolation loss vibrated greatly and increased around 0 dB in accompany with changes in frequency. This comes from the same reason for that a cosine trigonometric function is included in the equation (1) to obtain the abovementioned transparent characteristics $|S_{21}|^2$.

In a conventional device shown in FIG. 24, isolation was almost constant at frequency over 10 GHz, on the other hand, in the fifth preferred embodiment according to the present invention, as shown by the solid line XVI in FIG. 16, isolation vibrated and decreased as frequency became high. This vibration comes from the same reason for that a cosine trigonometric function is included in the equation (1) to obtain the abovementioned transparent characteristics $|S_{21}|^2$.

Therefore, according to the fifth preferred embodiment, it was possible to attain large power transmission, low insertion loss, and high isolation at the same time, which has so far never been realized.

For information, with respect to the characteristics at 42 GHz, the conventional device attained insertion loss −7.1 dB and isolation −30.4 dB, on the other hand, the third preferred embodiment attained insertion loss −0.48 dB and isolation −22.1 dB, thus characteristics have been improved to a great extent. By the way, it is possible to attain desired frequency characteristics by changing the gate width (the length of the gate electrode in active layer) and the length of the ohmic electrode appropriately.

Next, explanation is made on the sixth preferred embodiment shown in FIG. 9.

In the sixth preferred embodiment shown in FIG. 9, a GaAlAs system hetero connection FET was used as a semiconductor substrate, and FET whose gate length was 0.15 μm and the length of the gate electrode inside of the active layer 400 was 1 mm was used in both serial and parallel. The width of ohmic electrodes in both the first ohmic electrode 350 of the first FET and the shared electrode 370 was 20 μm, and 50 Ω impedances were connected to the first input/output terminal 10 and the second input/output terminal 20. And in order to make the gate bias circuit into a high impedance, 2 k Ω resistance element using epitaxial layer was inserted into the line between the gate electrode and the gate bias in each FET.

The transparent characteristics in the ON status and the OFF status of the semiconductor device of the sixth preferred embodiment under the present invention appeared same as the transparent characteristics shown in FIG. 16, and the sixth preferred embodiment attained insertion loss −0.48 dB and isolation −22.1 dB at 42 GHz, thus insertion loss has been improved to a great extent.

Then, explanation is made on the seventh preferred embodiment shown in FIG. 10.

In the seventh preferred embodiment shown in FIG. 10, a GaAlAs system hetero connection FET was used as a semiconductor substrate, and FET whose gate length was 0.15 μm and the length of its gate electrode inside of the active layer 470 was used in serial, while FET wherein the length of its gate electrode inside of the active layer 470 was 1 mm was used in parallel. The width of ohmic electrodes 410 of the first FET and the shared electrode was 20 μm, and 50 Ω impedances were connected to the first input/output terminal 10 and the second input/output terminal 20. And in order to make the gate bias circuit into a high impedance, 2 k Ω resistance element using epitaxial layer was inserted into the line between the gate electrode and the gate bias in each FET.

Figure 17:
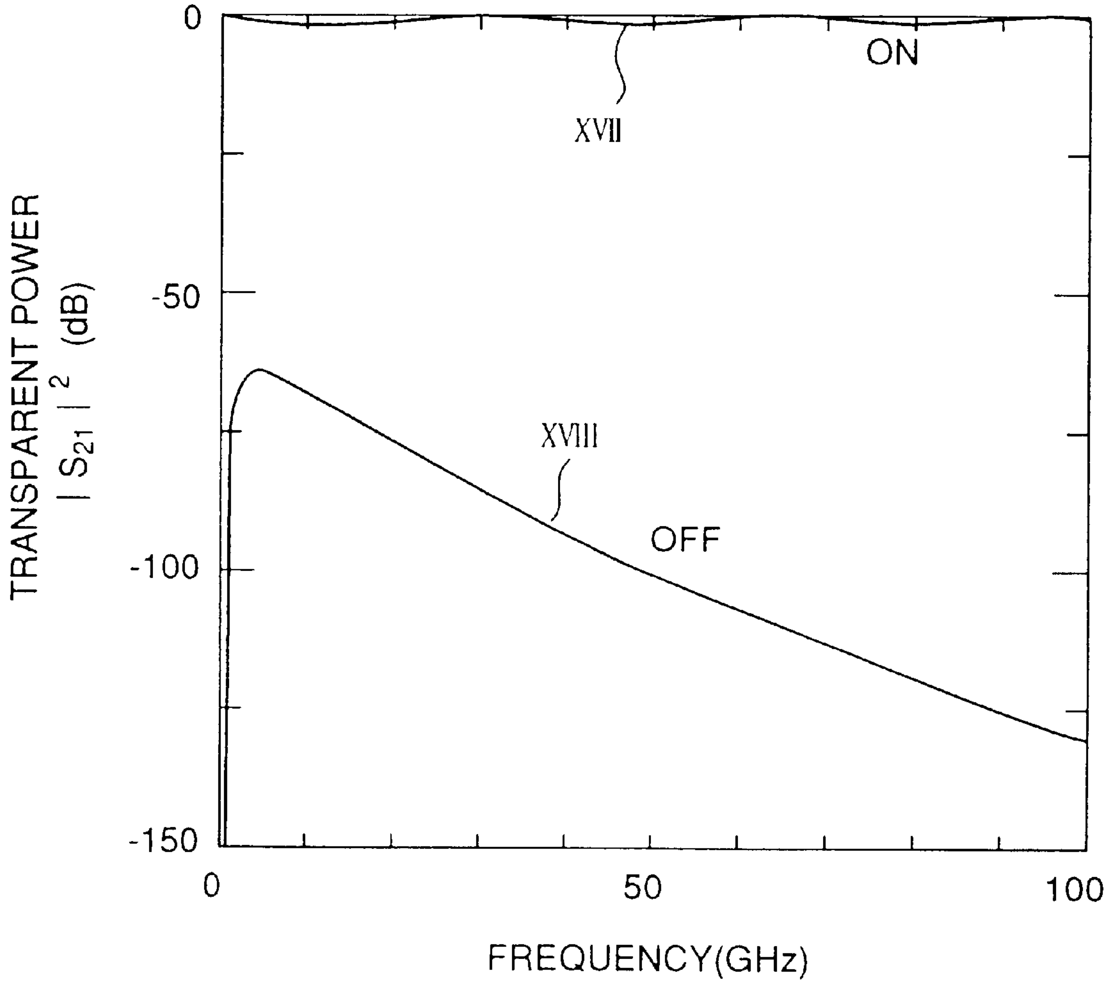
FIG. 17 is a diagram showing transparent characteristics of the seventh preferred embodiment under the present invention.

FIG. 17 shows the transparent characteristics in the ON status and the OFF status of the semiconductor device of the seventh preferred embodiment under the present invention.

Figure 30:
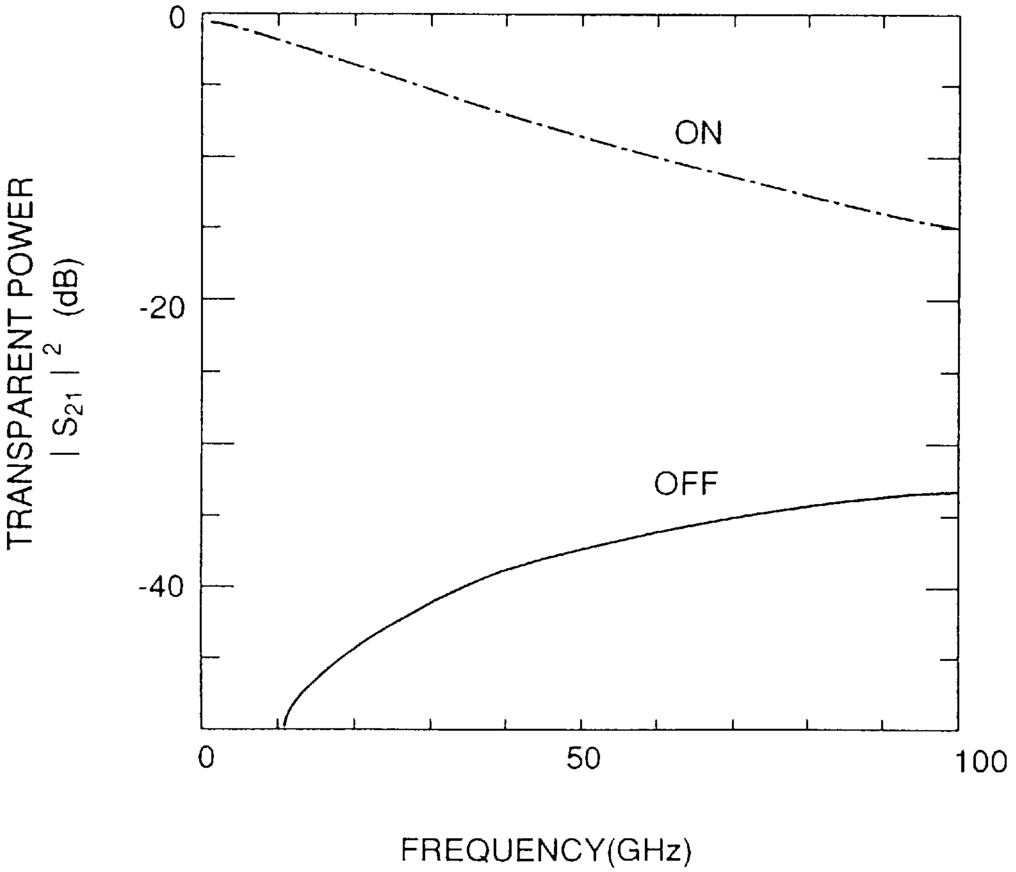
FIG.30 (PRIOR ART)
FIG. 30 is a diagram showing transparent characteristics of a switch having the structure in FIG. 29.

In a conventional device shown in FIG. 30, isolation loss increased greatly as the frequency increased, on the contrary, in the seventh preferred embodiment according to the present invention, as shown by the dashed line XVII in FIG. 17, though isolation loss vibrated greatly around 0 dB in accompany with changes in frequency, there was not monotonous increase. This comes from the same reason for that a cosine trigonometric function is included in the equation (1) to obtain the abovementioned transparent characteristics $|S_{21}|^2$.

And in a conventional device shown in FIG. 30, isolation decreased as the frequency increased, on the contrary, in the seventh preferred embodiment according to the present invention, as shown by the solid line XVIII in FIG. 16, isolation increased monotonously as frequency became high. Therefore, according to the seventh preferred embodiment, it was possible to attain large power transmission, low insertion loss, and high isolation at the same time, which has so far never been realized.

For information, with respect to the characteristics at 100 GHz, the conventional device attained insertion loss −14.8 dB and isolation −33.4 dB, on the other hand, the seventh preferred embodiment attained insertion loss −0.9 dB and isolation −132.1 dB, thus characteristics both in insertion loss and isolation have been improved to a great extent.

Next, explanation is made on the eighth preferred embodiment shown in FIG. 12.

In the eighth preferred embodiment shown in FIG. 12, a GaAlAs system hetero connection FET was used as a semiconductor substrate, and FET whose gate length was 0.15 μm and the length of the gate electrode inside of the active layer 570 was 1 mm was used in both serial and parallel. The width of ohmic electrodes in the first ohmic electrode 510 of the first FET was 100 μm and the width of the shared electrode 520 was 10 μm, and 50 Ω impedances were connected to the first input/output terminal 10 and the second input/output terminal 20. And in order to make the gate bias circuit into a high impedance, 2 k Ω resistance element using epitaxial layer was inserted into the line between the gate electrode and the gate bias in each FET.

Figure 18:
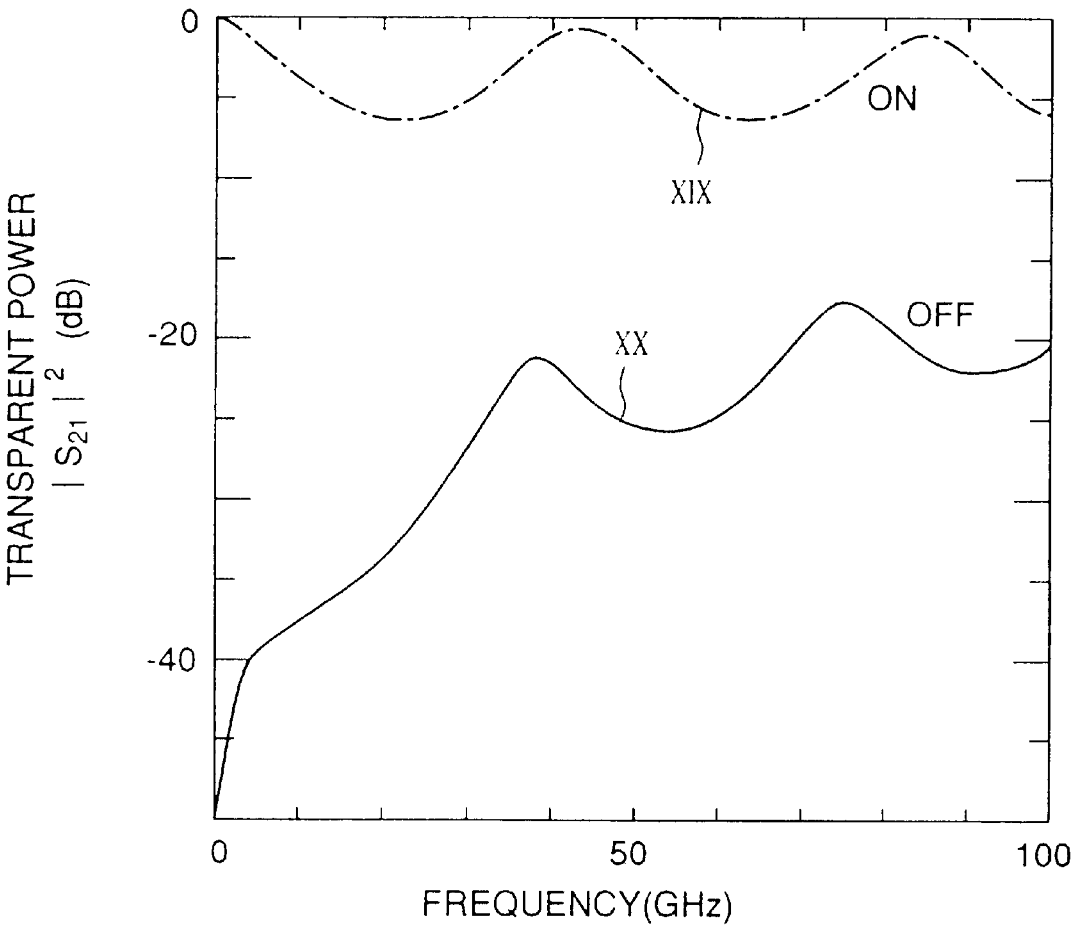
FIG. 18 is a diagram showing transparent characteristics of the eighth preferred embodiment under the present invention.
Figure 19:
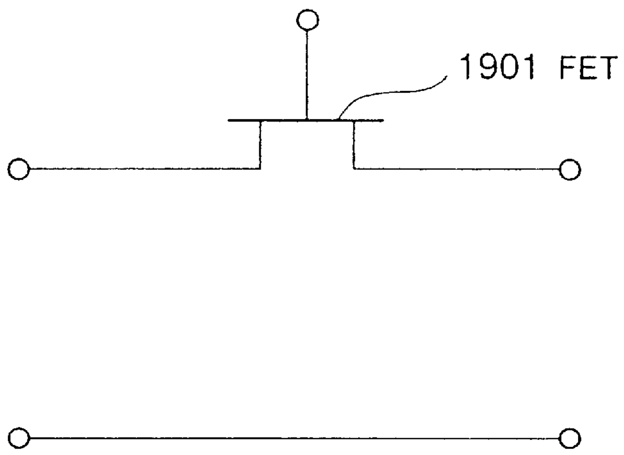
FIG. 19 is a circuit diagram showing a structure of a conventional serial structure switch.

FIG. 18 shows the transparent characteristics in the ON status and the OFF status of the semiconductor device of the eighth preferred embodiment under the present invention.

In a conventional device shown in FIG. 24, isolation loss increased greatly as the frequency increased, on the contrary, in the eighth preferred embodiment according to the present invention, as shown by the dashed line XIX in FIG. 18, though isolation loss vibrated around 0 dB in accompany with changes in frequency, there was not monotonous increase. This comes from the same reason for that a cosine trigonometric function is included in the equation (1) to obtain the abovementioned transparent characteristics $|S_{21}|^2$.

And in a conventional device shown in FIG. 24, isolation decreased as the frequency increased, on the contrary, in the eighth preferred embodiment according to the present invention, as shown by the solid line XX in FIG. 18, isolation characteristics though isolation loss vibrated around 0 dB in accompany with changes in vibrated and increased as frequency became high. Therefore, according to the eighth preferred embodiment, it was possible to attain large power transmission, low insertion loss, and high isolation at the same time, which has so far never been realized.

For information, with respect to the characteristics at 85 GHz, the conventional device attained insertion loss −12.4 dB and isolation −30.2 dB, on the other hand, the eighth preferred embodiment attained insertion loss −1.4 dB and isolation −21.4 dB, thus insertion loss has been improved to a great extent.

By the way, the present invention is not limited to the preferred embodiments mentioned heretofore, but for example, the width of an ohmic electrode and the thickness of a semiconductor substrate may be modified appropriately so that ohmic electrode in transmission line should have necessary characteristic impedance.

And it may be possible to change FET with a diode. Namely, the source and drain of FET may be replaced with anode (or cathode) and cathode (or anode) of a diode, for example, in the top view in FIG. 1, the firs ohmic electrode 40 of the first FET and the first ohmic electrode 60 of the second FET may be replaced with anodes (or cathode) of diode, and the shared electrode 50 may be cathode (or anode). In this case, the gate electrodes 70 and 80 are unnecessary.

And moreover, the present invention may also be to other circuits equal with the equivalent circuit diagrams in FIG. 2, FIG. 5, FIG. 8, FIG. 11, and FIG. 13.

As described heretofore, according to the present invention, it is possible to provide a semiconductor device that has a structure wherein the width of a gate electrode inside of an active layer and the length of a first ohmic electrode and a second ohmic electrode that pinch the above gate electrode are longer than at least 1/16 of a wavelength of used microwave or millimeter-wave, and the above ohmic electrode is made so as to function as a distributed-constant line, as a result, it is possible to satisfy the requirements to attain a large power transmission especially at a high frequency such as millimeter-wave or so, and a low insertion loss and a high isolation in a wide band, which has so far never been realized in the conventional semiconductor devices.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A semiconductor device having a semiconductor switch structure, comprising:

a plurality of incremental circuits connected in series forming a configuration each incremental circuit including a field effect transistor and a transmission line;

a total length of transmission lines of said respective incremental circuits being longer than at least 1/16 of propagation wavelength of microwave signals operative with said semiconductor device;

wherein said incremental circuits include two field effect transistors connected to each other at their drains, two first transmission lines connected respectively to sources of said two field effect transistors, and a second transmission line that is connected to drains of said two field effect transistors, wherein in the configuration of said incremental circuits, said first transmission line and said second transmission line in said incremental circuits are connected in series respectively, gates of said two field effect transistors are connected in common to gates of field transistors in other incremental circuits that are connected by said first transmission lines, in said incremental circuits positioned at one end of said configuration, the line ends of said serially connected said two first transmission lines that are not connected to said field effect transistor are a first input/output terminal, in said incremental circuits positioned at the other end of said configuration, the line ends of said serially connected said second transmission line that is not connected to said field effect transistor is a second input/output terminal, and the total length of said plural first transmission lines connected in series, and the total length of said plural second transmission lines connected in series are longer than 1/16 of the propagation wavelength of signals that said first and second input/output terminals input and output.

2. A semiconductor device having a semiconductor switch structure, comprising:

a plurality of incremental circuits connected in series forming a configuration, each incremental circuit including a field effect transistor and a transmission line;

a total length of each of said transmission lines in said incremental circuits being longer than at least 1/16 of propagation wavelength of microwave signals operative with said semiconductor device;

wherein said incremental circuits include said field effect transistors with a source that is grounded, said transmission lines are connected to drains of said field effect transistors, and in the configuration of said incremental circuits, said transmission lines in each of said incremental circuits are connected in series, gates of said field effect transistors are connected to gates of field effect transistors in other incremental circuits, in said incremental circuits positioned at one end of said configuration, the line ends of said serially connected to said transmission line that are not connected to said field effect transistor are set as a first input/output terminal, in said incremental circuits positioned at the other end said configuration, the line end of said serially connected to said transmission line that is not connected to said field effect transistor are set as a second input/output terminal, the total length of said plural transmission lines connected in series are set to be longer than 1/16 of the propagation wavelength of signals that said first and second input/output terminals input and output.

3. A semiconductor device having a semiconductor switch structure, comprising:

a plurality of incremental circuits connected in series forming a configuration, each incremental circuit including a first field effect transistor and first a transmission line;

a total length of each transmission line in said plurality of incremental circuits being longer than at least 1/16 of propagation wavelength of microwave signals operative with said semiconductor device;

wherein in each of said plurality of incremental circuits said first transmission line is connected to the source of said first field effect transistor, a second transmission line is connected to the drain of said first field effect transistor, the drain of a second field effect transistor is connected to the drain of said first field effect transistor and said second transmission line, and the source of said second field effect transistor is grounded, wherein in the configuration of said incremental circuits, said first transmission line and said second transmission line in each of said incremental circuits are connected in serial, gates of said first field effect transistors are connected in common to each other, while gates of said second field effect transistors are connected in common to each other, in said incremental circuits positioned at one end of said configuration, the line end of said serially connected plural transmission lines that is not connected to said first field effect transistor is a first input/output terminal, in said incremental circuits positioned at the other end said configuration, the line end of said connected plural second transmission lines that is not connected to said first field effect transistor is a second input/output terminal, and the total length of said plural first transmission lines connected in serial, and the total length of said plural second transmission lines connected in serial are set to be longer than 1/16 of the propagation wavelength of signals that said first and second input/output terminals input and output.

4. A semiconductor device having a semiconductor switch structure, comprising:

a plurality of incremental circuits in series forming a configuration, each incremental circuit including a first field effect transistor and a first transmission line;

a total length of transmission lines of each of said incremental circuits being longer than at least 1/16 of propagation wavelength of microwave signals operative with said semiconductor device;

wherein in each of said incremental circuits the first transmission line is connected to the source of said first field effect transistor, a second transmission line is connected to the drain of said first field effect transistor, and has an identical characteristic impedance to said first transmission line, a second field effect transistor whose drain is connected to the drain of said first field effect transistor and said second transmission line, the source of said second field effect transistor is grounded, wherein in the configuration of said incremental circuits, said first transmission line and said second transmission line in each of said incremental circuits are connected in series, gates of said first field effect transistor are connected in common to each other, gates of said second field effect transistors are connected in common to each other, in said incremental circuits positioned at one end of said configuration, the line ends of said serially connected first two transmission lines that are not connected to said first field effect transistor are a first input/output terminal, in said incremental circuits positioned at the other end of said configuration, the line end of said serially connected to said second transmission line that is not connected to said first field effect transistor is a second input/output terminal, and the total length of said plural first transmission lines connected in series, and the total length of said plural second transmission lines connected in series are longer than 1/16 of the propagation wavelength of signals that said first and second input/output terminals input and output.

5. A semiconductor device having a semiconductor switch structure, comprising:

a plurality of incremental circuits in series forming a configuration, each incremental circuit including a first field effect transistor and a first transmission line;

a total length of transmission lines of each of said incremental circuits being longer than at least 1/16 of propagation wavelength of microwave signals operative with said semiconductor device;

wherein in each of said incremental circuits the first transmission line is connected to the source of said first field effect transistor, a second transmission line is connected to the drain of said first field effect transistor, and has a different characteristic impedance than said first transmission line, a second field effect transistor whose drain is connected to the drain of said first field effect transistor and said second transmission line, the source of said second field effect transistor is grounded, wherein in the configuration of said incremental circuits, said first transmission line and said second transmission line in each of said incremental circuits are connected in series, gates of said first field effect transistor are connected in common to each other, gates of said second field effect transistors are connected in common to each other, in said incremental circuits positioned at one end of said configuration, the line end of said serially connected first two transmission lines that are not connected to said first field effect transistor is set as a first input/output terminal, in said incremental circuits positioned at the other end of said configuration, the line end of said second transmission line that is not connected to said first field effect transistor is a second input/output terminal, and the total length of said plural first transmission lines connected in series, and the total length of said plural second transmission lines connected in series are set to be longer than 1/16 of the propagation wavelength of signals that said first and second input/output terminals input and output.

6. A semiconductor device having a semiconductor switch structure, comprising:

a plurality of pieces of incremental circuits connected in series forming a configuration, each incremental circuit including a first field effect transistor and a first transmission line;

a total length of transmission lines of said respective incremental circuits being longer than at least 1/16 of propagation wavelength of microwave signals operative with said semiconductor device;

wherein said incremental circuits comprise a first incremental circuit having two field effect transistors and two transmission lines, and a second incremental circuit having one field effect transistor and a transmission line, in said first incremental circuit the first transmission line is connected to the source of said first field effect transistor, a second transmission line that is connected to the drain of said first field effect transistor, and has a different characteristic impedance from said first transmission line, a second field effect transistor whose drain is connected to the drain of said first field effect transistor and said second transmission line, and the source of said first field effect transistor is grounded; and said second incremental circuit comprising a field effect transistor having a grounded source, a third transmission line that is connected to the drain of said field effect transistor in said second incremental circuit, the configuration of said incremental circuits is structured by a series connection as the arrangement of said first incremental circuit, and the arrangement of said second incremental circuit; and in the configuration of said first incremental circuit, said first transmission line and said second transmission line in said first incremental circuit are connected in series, gates of said first field effect transistors are connected in common to each other, while gates of said second field effect transistors are connected in common to each other; and in the arrangement of said second incremental circuit, said transmission lines in said second incremental circuit are connected in series, the gate of said field effect transistor is connected in common to the gates in the other second incremental circuit, and said second transmission line of said first incremental circuit positioned at one end of the configuration of the first incremental circuit is connected in series to said third transmission line of said second incremental circuit positioned at the other end of said first incremental circuit, the gate of said second field effect transistor in said first incremental circuit positioned at one end of the configuration of said first incremental circuit is connected in common with said field effect transistor in said second incremental circuit positioned at the other end of the configuration of said second incremental circuit, in said incremental circuits positioned at the end of the configuration of said first incremental circuits that are not connected to said second incremental circuit, the line ends serially connected said first transmission line that are not connected to said field effect transistor are a first input/output terminal, in said incremental circuits positioned at the end the configuration of said second incremental circuit that are not connected to said first incremental circuits, the line ends serially connected said third transmission line that are not connected to said field effect transistor are a second input/output terminal, and the total length of said first transmission line in the first incremental circuits and said second transmission line in said second incremental circuit is set to be longer than 1/16 of the propagation wavelength of signals that said first and second input/output terminals input and output.

7. A semiconductor device having a semiconductor switch structure using a combination of field effect transistors covered with active layers, comprising:

said semiconductor device is structured by a combination of a gate electrode and a pair of ohmic electrodes that pinch said gate electrode, and part of said gate electrode and said ohmic electrodes are covered with an active layer; and the length of said gate electrode in said active layer, and the length of said ohmic electrodes are set to be longer than at least 1/16 of propagation wavelength of used microwave;

wherein a desired number of incremental circuits, comprising two field effect transistors, one of said pair of ohmic electrodes is a shared electrode, and said pair of ohmic electrodes are covered with said active layer and arranged at certain intervals so that said gate electrodes should be arranged in a straight line, and corresponding ohmic electrodes in said incremental circuits are connected, one end of said pair of ohmic electrodes that is not the shared electrode is set as a first input/output terminal;

the other end of said pair of ohmic electrodes that is the shared electrode is a second input/output terminal;

said two gate electrodes of said two field effect transistor pinched by the ohmic electrodes of said two field effect transistors are connected to each other outside of said active layer, and each length of said two gate electrodes in said active layer, and the length of said respective lines connecting said ohmic electrodes are set to be longer that at least 1/16 of the propagation wavelength of used microwave signal.

8. A semiconductor device having a semiconductor switch structure using a combination of field effect transistors covered with active layers, comprising:

said semiconductor device is structured by a combination of a gate electrode and a pair of ohmic electrodes that pinch said gate electrode, and part of said gate electrode and said ohmic electrodes are covered with an active layer; and length of said gate electrode in said active layer, and the length of said ohmic electrodes are set to be longer at least 1/16 of propagation wavelength of used microwave or millimeter-wave:

wherein two field effect transistors covered with said active layer are arranged wherein one of said pair of ohmic electrodes is set as a shared electrode, the ohmic electrode that is not grounded and is not said shared electrode is connected out of said active layer and is a first input/output terminal, the end opposite to said first input/output terminal of said ohmic electrode that is said shared electrode is a second input/output terminal, said two gate electrodes pinched by said two ohmic electrodes of said field effect transistors are connected outside of said active layer, and each length of said two gate electrodes in said active layer, and the length of said ohmic electrodes are longer than at least 1/16 of propagation wavelength of used microwave signal, respectively.

9. A semiconductor device having a semiconductor switch structure using a combination of field effect transistors covered with active layers, comprising:

said semiconductor device is structured by a combination of a gate electrode and a pair of ohmic electrodes that pinch said gate electrode, and part of said gate electrode and said ohmic electrodes are covered with an active layer; and length of said gate electrode in said active layer, and the length of said ohmic electrodes are set to be longer than at least 1/16 of the propagation wavelength of used microwave;

wherein a plurality of incremental circuits, comprising field effect transistors having said pair of ohmic electrodes, and covered with said active layer, are arranged at certain intervals so that said gate electrodes are arranged in a straight line, and one of the ohmic electrodes of said plurality of incremental circuits is connected, while the other is grounded, one end of said ohmic electrodes is a first input/output terminal, the other end of said ohmic electrodes is a second input/output terminal, and the length of said line connecting to said ohmic electrode in said active layer is set to be longer than at least 1/16 of the propagation wavelength of used microwave signal.

10. A semiconductor device having a semiconductor switch structure using a combination of field effect transistors covered with active layers, comprising:

said semiconductor device is structured by a combination of a gate electrode and a pair of ohmic electrodes that pinch said gate electrode, and part of said gate electrode and said ohmic electrodes are covered with an active layer; and length of said gate electrode in said active layer, and the length of said ohmic electrodes are set to be longer at least 1/16 of propagation wavelength of used microwave;

wherein field effect transistors covered with said active layer are arranged having said pair of ohmic electrodes, wherein one of said ohmic electrodes is grounded, one end of said ohmic electrode that is not grounded is a first input/output terminal, each of the length of said gate electrode in said active layer, and the length of the ohmic electrode that is not grounded are set to be longer than at least 1/16 of propagation wavelength of used microwave signal.

11. A semiconductor device having a semiconductor switch structure using a combination of field effect transistors covered with active layers, comprising:

said semiconductor device is structured by a combination of a gate electrode and a pair of ohmic electrodes that pinch said gate electrode, and part of said gate electrode and said ohmic electrodes are covered with an active layer; and length of said gate electrode in said active layer, and the length of said ohmic electrodes are set to be longer than at least 1/16 of the propagation wavelength of used microwave signal;

wherein a plurality of incremental circuits, comprising two field effect transistors wherein one of the ohmic electrodes in said pair of ohmic electrodes is set as a shared electrode, and covered with said active layer, said field effect transistors are arranged at certain intervals so that said gate electrodes should be arranged in a straight line, ohmic electrodes that are said shared electrodes among that corresponding above ohmic electrodes of adjacent incremental circuits of said plurality of incremental circuits are connected, while the other ohmic electrode in said pair of ohmic electrodes that is not said shared electrodes is grounded, one end of said ohmic electrodes is a first input/output terminal, the other end opposite to said first input/output terminal of the ohmic electrodes that are said shared electrodes is set as a second input/output terminal, and each of the length of said two gate electrodes in said active layer, each of the length of said lines to which said ohmic electrodes are connected are set to be longer than at least 1/16 of propagation wavelength of used microwave signal.

12. A semiconductor device having a semiconductor switch structure using a combination of field effect transistors covered with active layers, comprising:

said semiconductor device is structured by a combination of a gate electrode and a pair of ohmic electrodes that pinch said gate electrode, and part of said gate electrode and said ohmic electrodes are covered with an active layer; and the length of said gate electrode in said active layer, and the length of said ohmic electrodes are set to be longer at least 1/16 of propagation wavelength of used microwave;

wherein two pieces of field effect transistors covered with said active layer are arranged wherein one of said pair of ohmic electrodes of one of said field effect transistors is a shared electrode, and one of said ohmic electrodes is grounded, one end of said ohmic electrode that is not said shared electrode and is not grounded is a first input/output terminal, the end opposite to said first input/output terminal of the ohmic electrode that is said shared electrode is a second input/output terminal, and each of the length of said two gate electrodes in said active layer, and the length of each ohmic electrode are set to be longer than at least 1/16 of propagation wavelength of used microwave.

13. A semiconductor device having a semiconductor switch structure using a combination of field effect transistors covered with active layers, comprising;

said semiconductor device is structured by a combination of a gate electrode and a pair of ohmic electrodes that pinch said gate electrode, and part of said gate electrode and said ohmic electrodes are covered with an active layer; and the length of said gate electrode in said active layer, and the length of said ohmic electrodes are longer than at least 1/16 of propagation wavelength of used microwave;

wherein two field effect transistors covered with said active layer are arranged wherein one of said pair of ohmic electrodes of one of said field effect transistors is set as a shared electrode, and one of said ohmic electrodes is grounded, the length of said ohmic electrode that is not said shared electrode and is not grounded differs from the length of said ohmic electrode, and the length of said gate electrode that is pinched by said ohmic electrode that is not said shared electrode and is not grounded and the ohmic electrode that is said shared electrode differs from the length of other above gate electrodes, one end of said ohmic electrode that is not said shared electrode and is not grounded is set as a first input/output terminal, the end opposite to said first input/output terminal of the ohmic electrode that is said shared electrode is set as a second input/output terminal, and each of the length of said the ohmic electrode that is the shared electrode in said active layer, the length of the ohmic electrode that is grounded, and the length of one gate electrode that is pinched by said pair of ohmic electrodes is set to be longer than at least 1/16 of propagation wavelength of used microwave.

14. A semiconductor device having a semiconductor switch structure using a combination of field effect transistors covered with active layer, comprising:

said semiconductor device is structured by a combination of a gate electrode and a pair of ohmic electrodes that pinch said gate electrode, and part of said gate electrode and said ohmic electrodes are covered with an active layer; and length of said gate electrode in said active layer, and the length of said ohmic electrodes are set to be longer than at least 1/16 of propagation wavelength of used microwave;

wherein two field effect transistors covered with said active layer are arranged wherein one of said pair of ohmic electrodes of one of said field effect transistors is a shared electrode, and one of said ohmic electrodes is grounded, the length of said ohmic electrode that is not said shared electrode and is not grounded is shorter than the length of said ohmic electrode, and the length of said gate electrode that is pinched by said ohmic electrode that is not said shared electrode and is not grounded and the ohmic electrode that is said shared electrode is shorter than the length of other above gate electrode, one end of said ohmic electrode that is not said shared electrode and is not grounded is set as a first input/output terminal, and the end opposite to said first input/output terminal of the ohmic electrode that is said shared electrode is set as a second input/output terminal, and each of the length of said ohmic electrode that is the shared electrode in said active layer, the length of the ohmic electrode that is grounded, and the length of one gate electrode that is pinched by said pair of ohmic electrodes is set to be longer than at least 1/16 of propagation wavelength of used microwave.

15. A semiconductor device having a semiconductor switch structure using a combination of field effect transistors covered with active layers, comprising:

said semiconductor device is structured by a combination of a gate electrode and a pair of ohmic electrodes that pinch said gate electrode, and part of said gate electrode and said ohmic electrodes are covered with an active layer; and length of said gate electrode in said active layer, and the length of said ohmic electrodes are set to be longer at least 1/16 of propagation wavelength of used microwave;

wherein two pieces of field effect transistors covered with said active layer are arranged wherein one of said pair of ohmic electrodes of one of said field effect transistor is set as a shared electrode, and one of said ohmic electrodes is grounded, the width of said ohmic electrode that is not said shared electrode and is not grounded differs from the width of the ohmic electrode that is said shared electrode, one end of said ohmic electrode that is not said shared electrode and is not grounded is set as a first input/output terminal, the end opposite to said first input/output terminal of the ohmic electrode that is said shared electrode is set as a second input/output terminal, and each of the length of said two gate electrodes in said active layer, and the length of each ohmic electrodes are set to be longer than at least 1/16 of propagation wavelength of used microwave or millimeter-wave.

16. A semiconductor device as set forth in claim 8, wherein said two field effect transistors covered with said active layer are arranged wherein one of said pair of ohmic electrodes of one of said field effect transistors is set as a shared electrode, and one of said ohmic electrodes is grounded, the length of said ohmic electrode that is not said shared electrode and is not grounded is shorter than the length of said ohmic electrode, and the length of said gate electrode that is pinched by said ohmic electrode that is not said shared electrode and is not grounded and the ohmic electrode that is said shared electrode is shorter than the length of other above gate electrode, one end of said ohmic electrode that is not said shared electrode and is not grounded is set as a first input/output terminal, the end opposite to said first input/output terminal of the ohmic electrode hat is said shared electrode is set as a second input/output terminal, and each of the length of the ohmic electrode that is the shared electrode in said active layer, the length of the ohmic electrode that is grounded, and the length of one gate electrode that is pinched by said pair of ohmic electrodes is set to be longer than at least 1/16 of propagation wavelength of used microwave.

17. A semiconductor device as set forth in claim 8, wherein said two field effect transistors covered with said active layer are arranged wherein one of said pair of ohmic electrodes of one of said field effect transistors is set as a shared electrode, and one of said ohmic electrodes is grounded, the width of said ohmic electrode that is not said shared electrode and is not grounded differs from the width of the ohmic electrode that is said shared electrode, one end of said ohmic electrode that is not said shared electrode and is not grounded is set as a first input/output terminal, the end opposite to said first input/output terminal of the ohmic electrode that is said shared electrode is set as a second input/output terminal, and each of the length of said two gate electrodes in said active layer, and the length of each ohmic electrode are set to be longer than at least 1/16 of propagation wavelength of used microwave.

* * * * *